US009767245B1

(12) United States Patent
Mantik et al.

(10) Patent No.: US 9,767,245 B1
(45) Date of Patent: Sep. 19, 2017

(54) METHOD, SYSTEM, AND COMPUTER PROGRAM PRODUCT FOR IMPROVING MASK DESIGNS AND MANUFACTURABILITY OF ELECTRONIC DESIGNS FOR MULTI-EXPOSURE LITHOGRAPHY

(71) Applicant: Cadence Design Systems, Inc., San Jose, CA (US)

(72) Inventors: Stefanus Mantik, San Jose, CA (US); Vassilios C. Gerousis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 47 days.

(21) Appl. No.: 14/320,594

(22) Filed: Jun. 30, 2014

(51) Int. Cl.
*G06F 17/50* (2006.01)
(52) U.S. Cl.
CPC .............................. *G06F 17/5081* (2013.01)
(58) Field of Classification Search
USPC .......................................................... 716/52
See application file for complete search history.

(56) References Cited

U.S. PATENT DOCUMENTS

| | | | |
|---|---|---|---|
| 5,861,342 A * | 1/1999 | Gabriel | H01L 21/31051 257/E21.243 |
| 6,543,041 B1 | 4/2003 | Scheffer et al. | |
| 6,981,235 B1 | 12/2005 | Salowe et al. | |
| 7,089,526 B1 | 8/2006 | Salowe et al. | |
| 7,100,128 B1 | 8/2006 | Nequist et al. | |
| 7,100,129 B1 | 8/2006 | Salowe et al. | |
| 7,594,214 B1 | 9/2009 | Salowe et al. | |
| 7,676,781 B1 | 3/2010 | Salowe | |
| 8,065,652 B1 | 11/2011 | Salowe et al. | |
| 8,069,432 B2 | 11/2011 | Zhang et al. | |
| 8,086,978 B2 | 12/2011 | Zhang et al. | |
| 8,117,569 B1 | 2/2012 | Salowe | |
| 8,151,229 B1 | 4/2012 | Chang et al. | |
| 8,336,010 B1 | 12/2012 | Chang et al. | |
| 8,375,348 B1 | 2/2013 | Raj et al. | |
| 8,560,998 B1 | 10/2013 | Salowe et al. | |
| 8,640,080 B1 | 1/2014 | Salowe et al. | |
| 8,671,368 B1 | 3/2014 | Salowe et al. | |
| 8,762,908 B1 | 6/2014 | Chang et al. | |
| 8,782,570 B1 | 7/2014 | Li et al. | |
| 8,782,586 B2 | 7/2014 | Sezginer et al. | |
| 8,863,048 B1 | 10/2014 | Gerousis et al. | |
| 8,935,649 B1 | 1/2015 | Salowe | |

(Continued)

*Primary Examiner* — Mohammed Alam
(74) *Attorney, Agent, or Firm* — Vista IP Law Group, LLP

(57) ABSTRACT

Methods and systems for enhancing electronic designs for improving mask designs and manufacturability of electronic circuit designs for multi-exposure lithography are disclosed. The methods identify gap rectangles in a design and create gap blocks with the some of the identified gap rectangles according to at least their positions in a design and design rules. A relation graph is determined among the gap blocks or gap rectangles. The methods adjust some gap blocks by altering their sizes or dimensions. Some gap blocks may be split into multiple smaller gap blocks. The methods convert some gap rectangles into metal fill(s) and/or metal extensions to generate a structured physical design based at least in part upon the gap blocks and/or the multiple smaller gap blocks.

28 Claims, 18 Drawing Sheets

(56) References Cited

U.S. PATENT DOCUMENTS

| | | |
|---|---|---|
| 8,984,465 B1 | 3/2015 | Salowe |
| 9,003,349 B1 | 4/2015 | Salowe |
| 9,087,174 B1 | 7/2015 | Zhang et al. |
| 9,104,830 B1 | 8/2015 | Salowe et al. |
| 9,117,052 B1 | 8/2015 | Salowe et al. |
| 2003/0228714 A1* | 12/2003 | Smith .................. G06F 17/5068 438/8 |
| 2003/0229479 A1* | 12/2003 | Smith .................. G06F 17/5068 703/14 |
| 2004/0044978 A1* | 3/2004 | Juengling .................. G03F 1/36 716/52 |
| 2005/0064634 A1* | 3/2005 | Schmidt .............. B81C 1/00539 438/183 |
| 2008/0066027 A1 | 3/2008 | Mantik et al. |
| 2009/0055793 A1* | 2/2009 | Melzner .............. G06F 17/5077 716/130 |
| 2009/0319969 A1 | 12/2009 | Zhang et al. |
| 2010/0083198 A1 | 4/2010 | Zhang et al. |
| 2011/0014786 A1* | 1/2011 | Sezginer ............. G06F 17/5077 438/618 |
| 2012/0190188 A1* | 7/2012 | Zhao .................. H01L 23/53238 438/627 |
| 2014/0359548 A1 | 12/2014 | Gerousis et al. |

* cited by examiner

METHOD, SYSTEM, AND COMPUTER PROGRAM PRODUCT FOR IMPROVING MASK DESIGNS AND MANUFACTURABILITY OF ELECTRONIC DESIGNS FOR MULTI-EXPOSURE LITHOGRAPHY

CROSS-REFERENCE TO RELATED APPLICATION(S)

This Application is related to U.S. Prov. Patent App. Ser. No. 61/973,246 filed on Mar. 31, 2014 and entitled "METHOD, SYSTEM, AND COMPUTER PROGRAM PRODUCT FOR ENHANCING MANUFACTURABILITY OF ELECTRONIC DESIGNS FOR MULTI-EXPOSURE LITHOGRAPHY". The content of the aforementioned U.S. provisional patent application is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Some conventional lithographic techniques use grating plus trim resolution enhancement techniques such as sidewall image transfer (SIT) techniques to enhance design resolution for the manufacturing of electronic circuits with lithographic processes. These resolution enhancing techniques often result in complex geometries in the trim or block mask designs which in turn give rise to less than desired fidelity or even electrical problems (e.g., short) for certain circuit features. OPC (optical proximity correction) techniques may be used to correct some of these issues but may nevertheless introduce more complex geometries to further exacerbate the root cause of these problems—the complex geometries in the trim or block mask.

Therefore, there exists a need for effective and efficient techniques to enhancing manufacturability in multi-exposure lithography for electronic circuit designs.

SUMMARY

Disclosed are method(s), system(s), and article(s) of manufacture for improving mask designs and manufacturability of electronic circuit designs for multi-exposure lithography. These methods or system may identify the gap rectangles in an electronic design or a portion thereof and create one or more gap blocks with at least some of the identified gap rectangles based at least in part upon the positions of the identified gap rectangles in the design as well as upon one or more design rules. A relation graph may be determined among the gap blocks or gap rectangles for further processing the electronic design or the portion. The methods or systems may adjust some gap blocks by altering their sizes (in two dimensions) or dimensions (in one dimension for a gap block). Some gap blocks may be split into multiple smaller gap blocks that are situated along multiple tracks. The methods or system may convert some gap rectangles into one or more metal fills and/or one or more metal extensions to generate a structured physical design based at least in part upon the gap blocks and/or the multiple smaller gap blocks.

Some embodiments are directed at a method for improving mask designs and manufacturability of electronic circuit designs for multi-exposure lithography. In some embodiments, the method may identify gap rectangles based at least in part upon metal shapes in a portion of an electronic design, create one or more gap blocks by using at least the gap rectangles, and generate a physical design by at least converting at least one gap rectangle of the gap rectangles into metal fill or metal extension based at least in part upon the one or more gap blocks. In some of these embodiments, the method may further determine a relation data structure for the gap rectangles, gap blocks, or a combination thereof, and adjust a first gap block of the gap blocks. In determining a relation data structure, the method may identify a first gap block and one or more neighboring gap blocks that neighbor the first gap block, determine whether the first gap block shares an opposite link with one or more of the one or more neighboring gap blocks, and determine whether a first size or a first dimension of the first gap block may be adjusted in some embodiments. In some of these embodiments, the method may further change the first size or the first dimension of the first gap block in a first direction, wherein it is determined that the first size or the first dimension of the first gap block may be adjusted, change a second size or a second dimension of a neighboring gap block of the one or more neighboring gap blocks associated with the opposite link, and determine whether the portion of the electronic design satisfies one or more design rules governing at least the first gap block and the neighboring gap block. In addition or in the alternative, the method may determine a relation data structure by removing the first gap block or a neighboring gap block from the portion of the electronic design, and also by determining whether the portion of the electronic design satisfies one or more design rules governing at least the portion without the first gap block or the neighboring gap block in the portion. Some relation data structures may also be determine by moving the first gap block at a first location or a neighboring gap block at a second location to one or more different locations in the portion of the electronic design, and also by determining whether the portion of the electronic design satisfies one or more design rules governing at least the first gap block or the neighboring gap block that are moved to the one or more different locations, whereas at least one neighboring gap block of the one or more neighboring gap blocks may also be optionally adjusted in determining a relation data structure. A lower gap link or a higher gap link between the first gap block and the one or more neighboring gap blocks may be identified for a relation data structure, at least one neighboring gap block may be identified based at least in part upon the lower gap link or the higher gap link, and a sibling link and a first neighboring gap block associated with the sibling link may also be identified when determining a relation data structure in some embodiments.

A gap rectangle may be identified by identifying a track in the portion of the electronic design, identifying a gap along the track by traversing the track, identifying a length and/or a width of the gap, and identifying a first gap rectangle of the gap rectangles by using at least the length of the gap in some embodiments. In some of these embodiments, the gap rectangle may further be identified by identifying or determining an order of processing for at least the portion of the electronic design, identifying one or more additional tracks in the portion of the electronic design, identifying one or more remaining gap rectangles of the gap rectangles by at least scanning or traversing the one or more additional tracks based at least in part the order of processing.

A gap block may be created by identifying a first gap rectangle along a first track in the portion of the electronic design, and also by identifying a neighboring gap rectangle along a second track that neighbors the first track in the portion of the electronic design in some embodiments. In some of these embodiments, the method may create the gap block by further determining a common parallel projection along a first direction for the first gap rectangle and the neighboring gap rectangle, determining whether the common parallel projection satisfies one or more first design rules, determining whether the first gap rectangle or the neighboring gap rectangle is a part of a first gap block of the gap blocks, and extending the first gap block based at least in part upon a criterion, wherein the first gap rectangle or the neighboring gap rectangle is determined to be the part of the first gap block. In addition or in the alternative, a gap block may be created by identifying one or more second design rules, determining whether the first gap rectangle satisfies the one or more second design rules, splitting the first gap rectangle into multiple smaller gap rectangles based at least in part upon the one or more second design rules, creating a sibling link between at least two smaller gap rectangles of the multiple gap rectangles, and associating the sibling link with the at least two smaller gap rectangles by using a relation graph or a data structure.

The method may generate a physical design (e.g., a layout) of an electronic design by splitting a gap block into multiple smaller gap blocks along a track in the portion of the electronic design, associating at least one sibling link between two smaller gap blocks of the multiple smaller gap blocks, identifying a first gap rectangle corresponding to the sibling link, and also by inserting a metal fill element in an area occupied by the first gap rectangle in some embodiments.

Some embodiments are directed at a hardware module or system that may be invoked to perform any of the methods, processes, or sub-processes disclosed herein. The hardware system may include, for example, one or more wire-like fill or extension or metal fill processing modules to insert, modify, or improve wire-like fill and/or metal fill segments, a design optimization module to improve or optimize electronic designs with wire-like fill or extension and/or metal fill segments, a track processing module to process routing tracks of interest in electronic designs, a photomask designation module to associate tracks or design components with photomask designs, and/or a wire processing module to process wire segments, etc. in some embodiments. The hardware system may further include one or more forms of non-transitory machine-readable storage media or devices to temporarily or persistently store various types of data or information such as the firmware. At least one of these aforementioned modules works in conjunction with at least one processor executing one or more threads of execution and/or the non-transitory machine-readable storage media or devices of a computing system to perform various acts described in this application. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for enhancing manufacturability of electronic designs for multi-exposure lithography are described below with reference to FIGS. 1-8.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are directed to methods, systems, and articles of manufacture for enhancing manufacturability of electronic designs for multi-exposure lithography. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
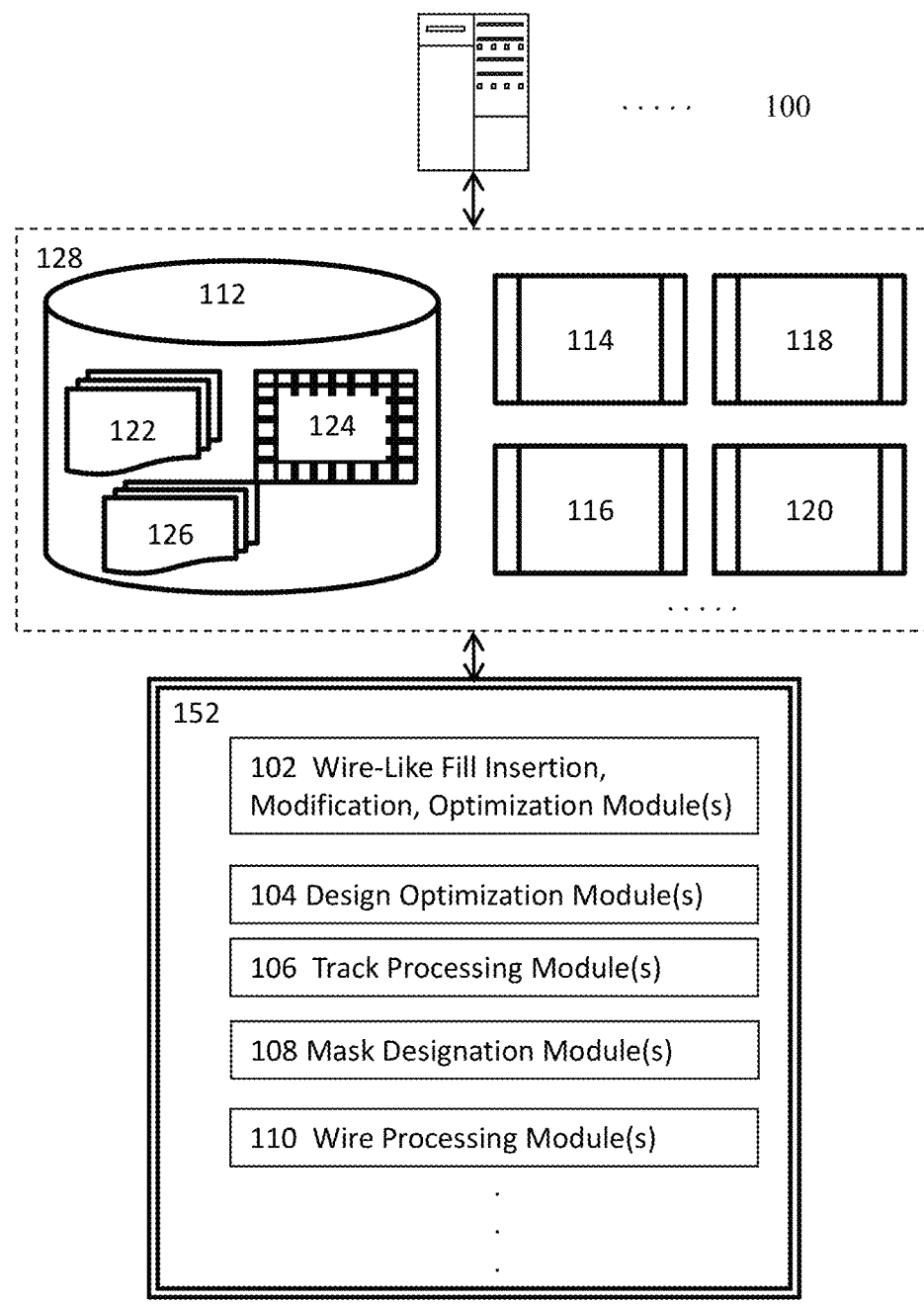
FIG. 1 illustrates a illustrative high level schematic flow diagrams for a system for improving mask designs and manufacturability of electronic circuit designs for multi-exposure lithography in some embodiments.

Disclosed are method(s), system(s), and article(s) of manufacture for enhancing manufacturability of electronic designs for multi-exposure lithography in one or more embodiments. In one or more embodiments, FIG. 1 illustrates an illustrative high level schematic block diagrams for enhancing manufacturability of electronic designs for multi-exposure lithography and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a floorplanner, a global routing engine, and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database (s) or physical design database(s), electronic circuit design specification database(s), various statistics, various data, rule decks, various design rules, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more wire-like fill insertion, modification, improvement, and optimization modules 102 to insert, remove, modify, improve, optimize, or otherwise operate upon wire-like fill structures, one or more design optimization modules 104 to improve or optimize electronic designs, one or more track processing modules 106 to perform various operations on routing tracks, one or more mask designation modules 108 to designate or assign electronic design components to various photomask designs, one or more wire processing modules 110 to process wires, vias, interconnects, or other geometries or shapes associated with wires, vias, or interconnects (collectively wire or wires hereinafter), etc.

A routing track or simply a track (hereinafter a "track") includes a one-dimensional fictitious line or line segment derived from the manufacturing grids provided by foundries. A routing track thus having zero width in physical designs (e.g., a layout of an electronic design) and is used to guide physical implementation tools (e.g., floorplanner, placement tools, or routing tools) to implement the physical design for an electronic design. For example, a routing tool may lay the centerline of a wire segment along a routing track during the routing process. A routing track may nonetheless be associated with a width to indicate that the particular routing track is to be used to route wires having the associated width. In this application, some routing tracks may be illustrated as rectangular shapes to indicate that such routing tracks are associated with the widths as shown in various figures. Nonetheless, the rectangular representations of such routing tracks are not intended to explicitly, implicitly, or inherently indicate that routing tracks have two-dimensional geometrical structures or shapes.

Figure 2:
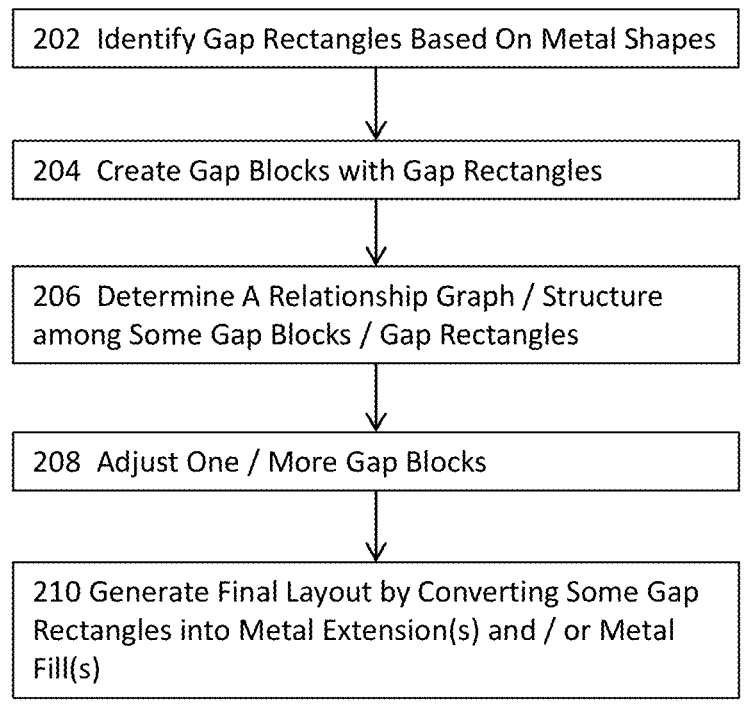
FIG. 2 illustrates a high level schematic flow diagram for a method or system for improving mask designs and manufacturability of electronic circuit designs for multi-exposure lithography in some embodiments.

FIG. 2 illustrates a high level schematic flow diagram for a method or system for improving mask designs and manufacturability of electronic circuit designs for multi-exposure lithography in some embodiments. In these embodiments, the method or system may identify multiple gap rectangles from a layer or a portion thereof in an electronic design at 202. A gap rectangle comprises a reference rectangle that is situated along a track between two shapes (e.g., wires, interconnects, pins, pads, terminals, etc.) or between an end of a shape and the boundary of a region. A gap rectangle assumes or inherits the width associated with the track and has a length that is defined by distance between the respective end points of the shapes on both sides of the gap rectangle or the distance between one end of a shape and the boundary of the region. In these embodiments, a gap rectangle represents the empty space between two shapes or between one shape and the boundary of a region, while inheriting the width associated with the track. Therefore, a gap rectangle does not include any geometric features that ever exist in an electronic design or any photomask designs therefor. In contrast, a shape includes a geometric feature that physically exists in an electronic design or a mask design and will be manufactured either as a final feature or as an intermediate product leading to the final feature. In these embodiments, gap rectangles represent the aforementioned geometric features artificially created for performing various functions or for achieving various purposes described herein. Gap blocks in a region may be identified by traversing each track in the region in a bottom-up or top-down manner. Gap blocks in another region may be identified by traversing each track in the region in a left-to-right or right-to-left manner. More details about identifying gap rectangles will be described in subsequent paragraphs with reference to FIG. 3. At 204, the method or system may form or create one or more gap blocks by using at least the multiple gap rectangles. A gap block includes a plurality of gap rectangles as well as the empty space situated in the empty space between the plurality of gap rectangles in some embodiments. In some of these embodiments, the gap block for the plurality of gap rectangles includes a width that is the minimal length of the plurality of gap rectangles. In some embodiments, the width of a gap block may also be referred to as a pillar width for a mask design. The gap block has a height bounded by the two outermost boundary segments of the two outermost gap rectangles of the plurality of gap rectangles. More details about forming gap blocks with gap rectangles will be described in subsequent paragraphs with reference to FIGS. 4 and 4A. At 206, the method or system may determine a relation graph or a relation data structure among some gap blocks, gap rectangles, or any combinations thereof. A relation graph includes information about the links or relations between two gap blocks. It shall be noted that the terms "link" and "relation" may be used interchangeably throughout this Application. It shall also be noted that a relation graph may or may not be a graph representation of the relations. Rather, a relation graph may include a data structure storing one or more relations among the gap rectangles, gap blocks, or a combination thereof. Therefore, the term "relation graph" and "relation data structure" are used interchangeably throughout this disclosure. The method or system may determine the relation graph based at least in part upon one or more factors including, for example, spacing between two gap blocks, closest distance between two gap blocks, sibling link between two gap blocks, higher gap link between two gap blocks, lower gap link between two gap blocks, or any combinations thereof in some embodiments. More details about the relation graph will be described in subsequent paragraphs with reference to FIGS. 4B-C. At 208, the method or system may adjust one or more gap blocks. More details about adjusting one or more gap blocks will be described in subsequent paragraphs with reference to FIG. 4D. At 210, the method or system may convert some gap blocks into one or more metal extensions and/or one or more metal fills to generate a layout. More details about converting a gap block into a metal extension or a metal fill will be described in subsequent paragraphs with reference to FIG. 5.

Figure 3:
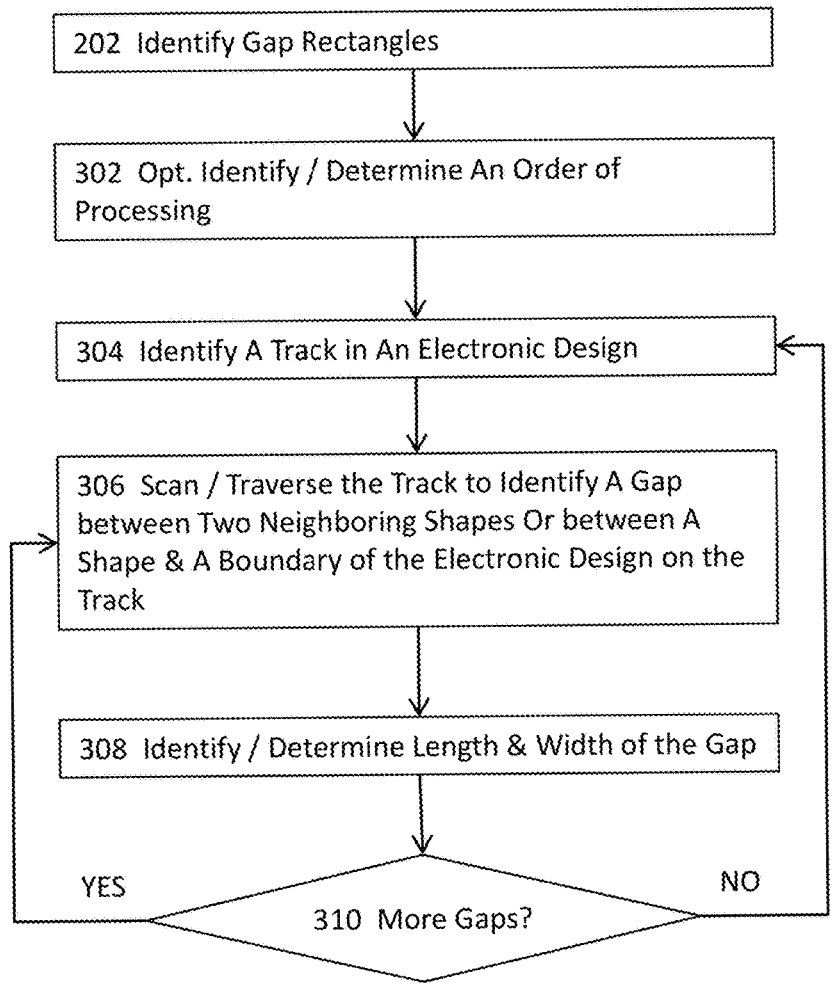
FIG. 3 illustrates a schematic flow diagram for a process or module illustrated in FIG. 2 for improving mask designs and manufacturability of electronic circuit designs for multi-exposure lithography in some embodiments.

FIG. 3 illustrates a schematic flow diagram for a process or module illustrated in FIG. 2 for improving mask designs and manufacturability of electronic circuit designs for multi-exposure lithography in some embodiments. More specifically, these embodiments illustrated in FIG. 3 illustrate more details about the process or module 202 of identifying gap rectangles illustrated in FIG. 2. In these embodiments, the method or system may optionally identify or determine an order of processing an electronic design or a portion thereof at 302. In some of these embodiments, the order of processing may include a bottom-up processing order to process an electronic design or a portion thereof starting from the bottom (with reference to, for example the view screen) of the electronic design or the portion thereof, a top-down processing order, a left-to-right processing order, a right-to-left processing order, or a combination thereof (e.g., a bottom-up and left-to-right processing order starting from the bottom left corner of the design or a portion thereof). The method or system may identify a track in an electronic design or a portion thereof at 304 and scan or traverse the identified track to identify a gap between two immediately neighboring shapes or between a shape and a boundary of the electronic design or the portion at 306. A gap includes an empty space having one side that abuts against one end of a metal shape and an opposite side that abuts against the boundary of a design region or one end of another metal shape. At 308, the method or system may identify or determine the length and/or the width of the gap. In these embodiments, a gap represents the empty space between the two immediately neighboring shapes or between one shape and the boundary of a portion of the design. The width of the gap may thus be determined from the width associated with the track identified at 304. The length of the gap may be determined from the shortest distance between the two opposing ends of the two shapes or the shortest distance between the boundary of the portion and the closer end of the shape. The method or system may thus identify a gap rectangle as the empty space bounded by the rectangle having the identified width and length. At 310, the method or system may further traverse the track to identify additional gaps along the track. If one or more additional gaps are identified along the track before the method or system reaches the end of the track, the method or system may return to 306 to further scan the track to determine whether there is at least one additional gap to be identified and repeat the identification or determination at 308. If no further gaps are identified before the method or system reaches the end of the identified track, the method or system may return to 304 to identify another track and repeat the actions in 304-308 until all the tracks in the electronic design or the portion thereof are processed.

Figure 4:
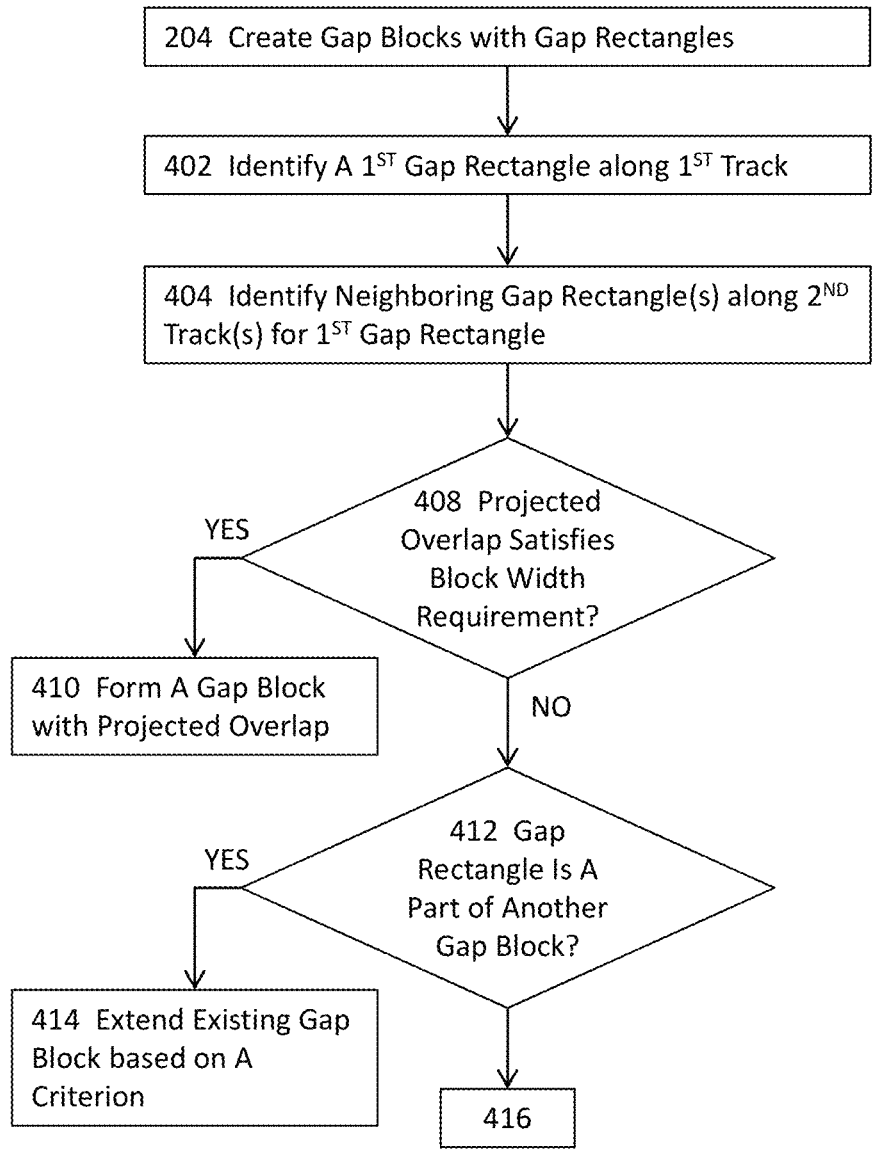
FIGS. 4 and 4A jointly illustrate a schematic flow diagram for a process or module illustrated in FIG. 2 for improving mask designs and manufacturability of electronic circuit designs for multi-exposure lithography in some embodiments.
Figure 4A:
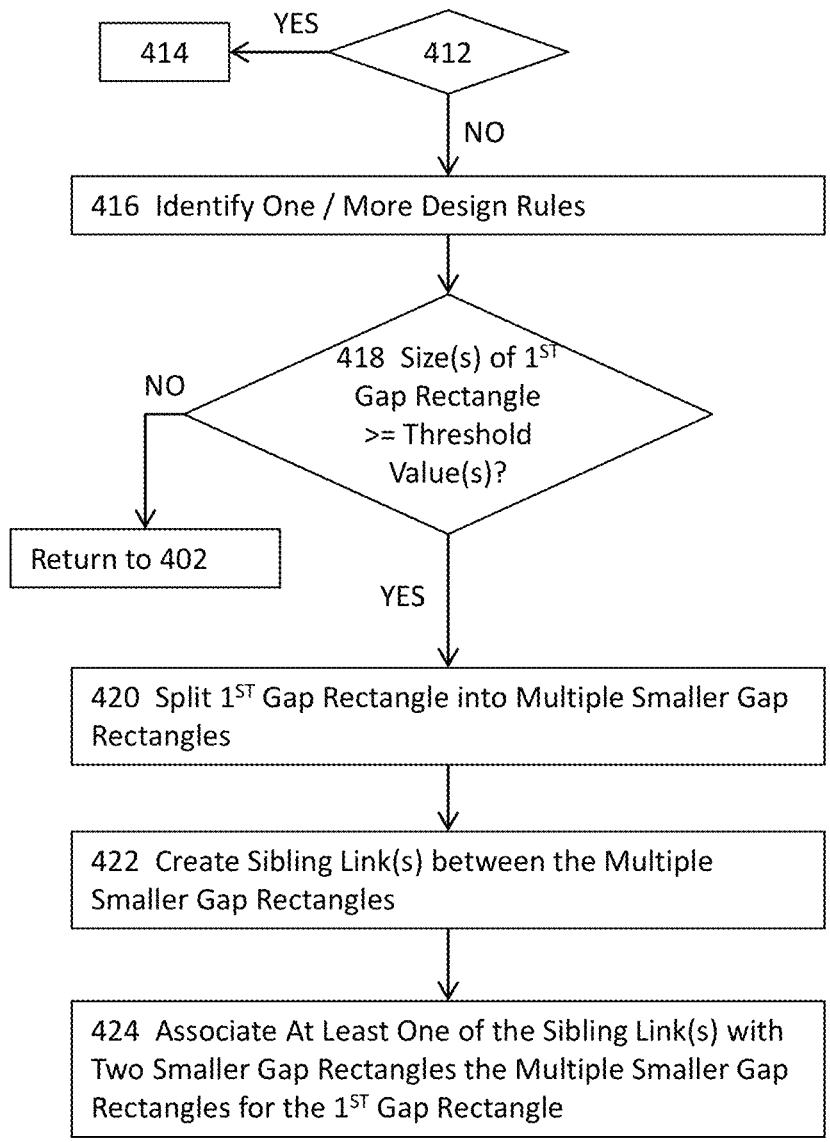

FIGS. 4 and 4A jointly illustrate a schematic flow diagram for a process or module illustrated in FIG. 2 for improving mask designs and manufacturability of electronic circuit designs for multi-exposure lithography in some embodiments. More specifically, these embodiments illustrated in FIG. 3 illustrate more details about the process or module 204 of forming a gap block illustrated in FIG. 2. In these embodiments, the method or system may identify a first gap rectangle along a first track at 402. The method or system may then identify one or more neighboring gap rectangles along one or more second tracks for the first gap rectangle at 404. The one or more second track may include a track that immediately neighbors the first track without any intervening tracks between the track and the first track in some embodiments. The one or more second tracks may include the track that neighbors the first track with one or more intervening tracks between the first track and the track in some other embodiments. At 408, the method or system may determine whether or not the projected overlap between the first gap rectangle and the second gap rectangle satisfies the bock width requirement, constraint, or design rule (collectively "requirement" hereinafter). In some embodiments, the block width requirement or design rule specifies a minimum width that a gap block is required or desired to satisfy. A projected overlap between the first and the second gap rectangles indicates the length of the overlap between the first and the second gap rectangles along the direction of a track when the first gap rectangle on the first track is projected onto the second track, or when the second gap rectangle on the second track is projected onto the first track in some of these embodiments. If it is determined that the projected overlap satisfies the block width requirement, the method or system may proceed to 410 to form a gap block with the projected overlap. The formed gap block may have the length of the projected overlap as the width of the gap block and the distance between the two outermost boundary segments of the first and the second gap rectangles as the length of the gap block. If it is determined that the projected overlap does not satisfy the block width requirement, the method or system may proceed to 412 to determine whether one of the first and the second gap rectangles is a part of an existing gap block. A gap rectangle may be considered as being a part of a gap block if the gap block at least partially covers the space represented by the gap rectangle in some embodiments. In these embodiments, a gap rectangle is considered a part of an existing gap block if the space represented by the gap rectangle overlaps and the space represented by the existing gap block overlap in part or in all. If it is determined that one of the first and the second gap rectangles is a part of an existing gap block, the method or system may proceed to 414 to extend the existing gap block based on one or more factors or criteria. In some of these illustrated embodiments, the factors or criteria may include the block width requirement. If it is determined that neither the first gap rectangle nor the second gap rectangle is a part of any existing gap block, the method or system may proceed to 416 to identify one or more design rules. More details about the one or more design rules will be described in subsequent paragraphs with reference to FIGS. 6A-D. At 418, the method or system may further determine whether or not the first gap rectangle satisfies one or more design rules identified at 416. For example, the method or system may determine whether one or more dimensions or the size of the first gap rectangle is larger than or equal to the corresponding threshold size or the one or more corresponding threshold dimensions at 418. The one or more dimensions of a gap rectangle may include, for example, the width or the length of the gap rectangle, and the size of a gap rectangle may include the area of the gap rectangle in some embodiments. If it is determined that the size or the one or more dimensions of the first gap rectangle is not larger than or equal to the corresponding threshold size or the one or more corresponding threshold dimensions, the method or the system may return to 402 to identify another gap rectangle and repeats the actions 402-418 as described above. Otherwise, if it is determined that the size or the one or more dimensions of the first gap rectangle is larger than or equal to the corresponding threshold size or the one or more corresponding threshold dimensions, the method or the system may proceed to 420 to split the first rectangle into multiple smaller gap rectangles. The multiple smaller gap rectangles may be immediately adjacent to one another with no intervening gaps or gap rectangles in some embodiments. The multiple smaller gap rectangles may also be adjacent to one another with an intervening gap or gap rectangle between two of the multiple smaller gap rectangles in some other embodiments. At 422, the method or system may create a sibling link between two neighboring smaller rectangles, which do not share a common boundary segment. A sibling link may be used to link two gap rectangles or two gap blocks to indicate that these two gap rectangles or two gap blocks are obtained by subdividing a larger gap rectangle or a larger gap block, respectively in some embodiments. At 424, the method or system may associate at least one sibling link created at 422 with two smaller gap rectangles of the multiple smaller gap rectangles for the first gap rectangle.

Figure 4B:
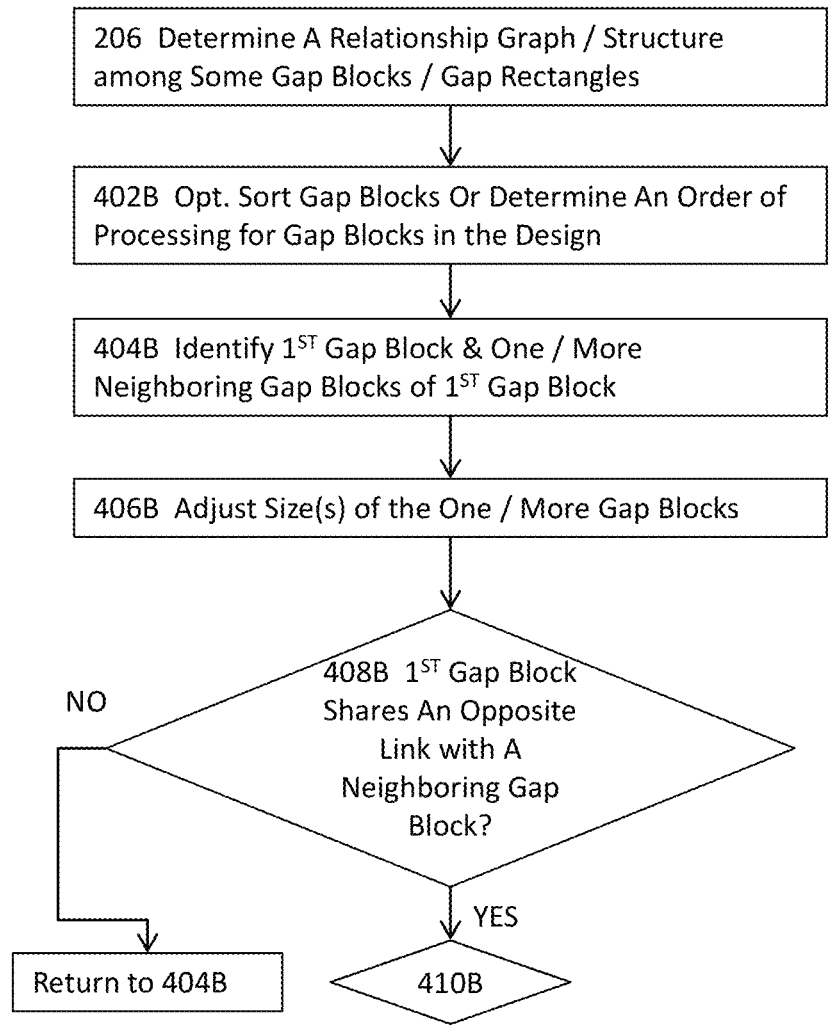
FIGS. 4B-C jointly illustrate a schematic flow diagram for a process or module illustrated in FIG. 2 for improving mask designs and manufacturability of electronic circuit designs for multi-exposure lithography in some embodiments.
Figure 4C:
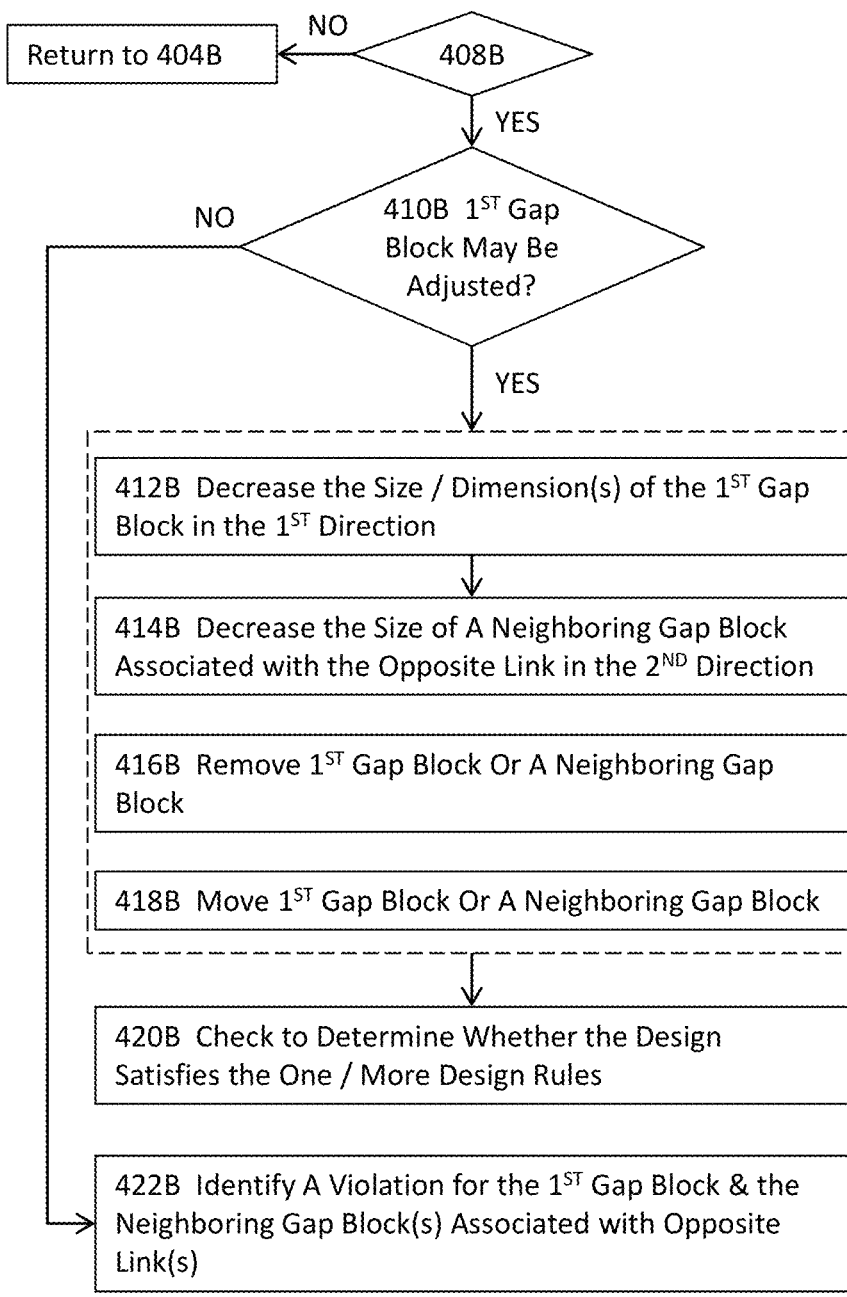

FIGS. 4B-C jointly illustrate a schematic flow diagram for a process or module illustrated in FIG. 2 for improving mask designs and manufacturability of electronic circuit designs for multi-exposure lithography in some embodiments. More specifically, FIGS. 4B-C illustrate more details about the ac 206 of determining a relation graph among gap blocks, gap rectangles, or a combination thereof in some embodiments. In these embodiments illustrated in FIGS. 4B-C, the method or system may optionally sort multiple gap blocks or determine an order of processing for gap blocks in the electronic design or a portion thereof at 402B in substantially similar manners as those described for 302 of FIG. 3. At 404B, the method or system may identify a first gap block and one or more neighboring gap blocks for the first gap block. In some embodiments where the first gap block is situated along one or more first tracks, the one or more neighboring gap blocks may be situated along one or more tracks that are immediately neighboring the one or more first tracks without any intervening tracks or are neighboring the one or more first tracks with at least one intervening track in between. The method or system may adjust the size or one or more dimensions of at least one gap block of the one or more neighboring gap blocks and the first gap block at 406B.

Figure 4D:
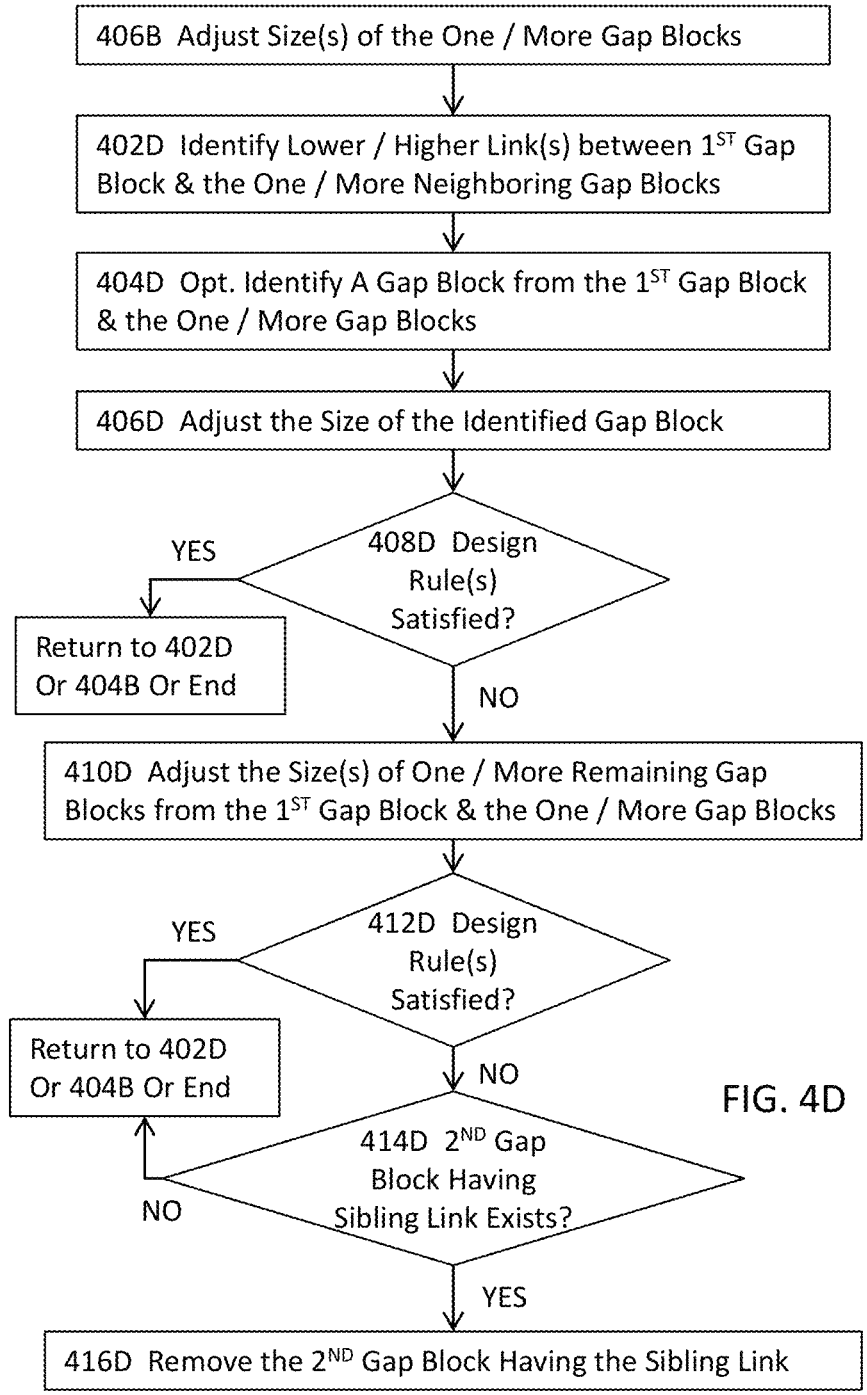
FIG. 4D illustrates a schematic flow diagram for a process or module illustrated in FIGS. 4B-C for improving mask designs and manufacturability of electronic circuit designs for multi-exposure lithography in some embodiments.

More details about adjusting the size or one or more dimensions of a gap block are described in subsequent paragraphs with reference to FIG. 4D. At 408D, the method or system may determine whether the first gap block shares an opposite link with a neighboring gap block of the one or more neighboring gap blocks identified at 404B. In some of these illustrated embodiments, an opposite link or an opposite relation (hereinafter "opposite link" collectively) may be associated with two separate shapes (e.g., gap blocks) that may or may not overlap each other in the direction orthogonal to the direction of the tracks along which the two shapes are situated. These two shapes may be subject to one or more design rules governing the spacing between the ends of these two shapes. The method or system may use an opposite link to identify that the corresponding shapes fail to satisfy one or more pertinent design rules such that it may be necessary or desired to perform one or more fixes on one or both shapes to meet the one or more pertinent design rules. In some embodiments where the method or system may perform one or more fixes to shapes associated with or sharing an opposite link, the results of the one or more fixes may change the opposite link into another type of link. In these embodiments, the method or system may further update the opposite link or the data structure storing various links in an electronic design accordingly. For example, an opposite link may be changed to an upper gap link or a lower gap link due to a fix performed on a gap block associated with the opposite link. Changing an opposite link to another link may be needed or desired to, for example, maintain the spacing between the two original gap blocks associated with or sharing the opposite link because other processes performed on other features in the same design may affect one of these two gap blocks. If it is determined at 408B that the first gap block does not share an opposite link with any neighboring gap blocks of the one or more gap blocks identified at 404B, the method or system may return to 404B to identify another gap block and one or more neighboring gap blocks and repeat the actions 404B-408B. On the other hand, if it is determined that the first gap block shares an opposite link with any neighboring gap blocks of the one or more gap blocks identified at 404B, the method or system may proceed to 410B to further determine whether the first gap block may be adjusted. If the determination is negative, the method or system may proceed to 422B to identify a design rule violation for the first gap block and the neighboring gap block that are associated with or share the opposite link in some embodiments. In these embodiments, the non-adjustability of the first gap block that fails to satisfy a design rule may indicate an issue that was created by an electronic automation tool (e.g., a detail router generating a layout from which the first gap block is identified), and that the issue cannot be fixed without returning to the same electronic automation tool to re-implement at least a portion of the electronic design from which the first gap block is identified. On the other hand, if it is determined that the first gap block may be adjusted at 410B, the method or system may proceed to 412B to decrease the size or one or more dimensions of the first gap block in the first direction in some embodiments. In some of these embodiments, the first direction includes the direction along which one or more tracks associated with the first gap block run in the electronic design. The method or system may further decrease the size of a neighboring gap block associated with the opposite link in the second direction in some of these embodiments at 414B. A second direction may include a direction orthogonal to the first direction. For example, the first direction may include the right-way routing direction, and the second direction may include the wrong-way routing direction in some embodiments. In the alternative, the method or system may proceed from 410B to 416B to remove the first gap block or a neighboring gap block associated with the opposite link with the first gap block in some of these embodiments illustrated in FIG. 4C. In some other embodiments, the method or system may alternatively move the first gap block or a neighboring gap block sharing the opposite link with the first gap block at 418B. Once the first gap block or a neighboring gap block thereof is adjusted so that the first gap block and the neighboring gap block sharing the opposite link satisfy one or more pertinent design rules, the method or system may check to determine whether the electronic design or a portion thereof (e.g., the gap block pair including the first gap block and the neighboring gap block sharing the opposite link) satisfies one or more pertinent design rules at 420B.

FIG. 4D illustrates a schematic flow diagram for a process or module illustrated in FIGS. 4B-C for improving mask designs and manufacturability of electronic circuit designs for multi-exposure lithography in some embodiments. More specifically, FIG. 4D illustrates more details about the process or module 406B for adjusting the size or one or more dimensions of one or more neighboring gap blocks of the first gap block of FIG. 4B. In these embodiments, the method or system may identify one or more lower gap links and/or one or more higher gap links between the first gap block and the one or more neighboring gap blocks at 402D. A higher gap link or a lower gap link may be created to link two non-overlapping shapes on two separate tracks when the distance between or relative position of the two shapes fails to satisfy one or more design rules in some embodiments. Once the method or system performs one or more fixes to comply with the one or more design rules, the method or system may nevertheless have the option to keep the lower gap link and/or the higher gap link associated with these two shapes in some embodiments. In these embodiments, the existence of a higher gap link and/or a lower gap link between two shapes may not indicate any design rule violations.

The terms "lower" and "higher" may be determined by examining the relative position of the two shapes. For example, a link that is created for linking a first gap block to a second gap block may be referred to as a higher gap link if a reference geometry (e.g., a center line, a center point, an edge, etc.) of the first gap block has a smaller coordinate along the vertical or horizontal axis than that of the second gap block. Similarly, a link that is created to link a first gap block to a second gap block may be referred to as a lower gap link if a reference geometry (e.g., a center line, a center point, an edge, etc.) of the first gap block has a larger coordinate along the horizontal or vertical axis than that of the second gap block.

At 404D, the method or system may identify a gap block from the first gap block and the one or more gap blocks. In some embodiments, the method or system may first sort the first gap block and the one or more gap blocks according to their dimensions in one or both directions (e.g., width and/or length). The method or system may then adjust the size or dimension of a gap block at 406D based at least in part upon one or more design rules. For example, if the distance (e.g., the closest distance) between the first gap block and a neighboring gap block violates a spacing requirement, the method or system may shrink the width or the length of one of the two gap blocks to meet the spacing requirement at 406D. At 408D, the method or system may determine whether or not the first block and the corresponding neighboring gap block sharing a lower or higher gap block satisfy one or more pertinent design rules. If it is determined that the first block and the corresponding neighboring gap block sharing a lower or higher gap block satisfy the one or more pertinent design rules, the method or system may return to 402D to identify another lower or higher gap link for the first gap block, to 404B to identify another first gap block and its one or more neighboring gap blocks, or to end the process if no gap blocks are to be further processed. Otherwise, the method or system may proceed to 410D to adjust the size of one or more dimensions of the one or more remaining gap blocks from the first gap block and its one or more neighboring gap blocks. For example, the method or system may adjust the width of the first gap block at 406D and yet determines that the first gap block and the corresponding neighboring gap block still fails to meet the spacing requirement at 408D. In this example, the method or system may further adjust the width of the corresponding neighboring gap block at 410D. The method or system may further determine whether the adjusted first gap block and the adjusted corresponding gap block satisfy the one or more pertinent design rules at 412D. If it is determined that the adjusted first block and the adjusted corresponding neighboring gap block sharing a lower or higher gap block satisfy the one or more pertinent design rules, the method or system may return to 402D to identify another lower or higher gap link for the first gap block, to 404B to identify another first gap block and its one or more neighboring gap blocks, or to end the process if no gap blocks are to be further processed. Otherwise, the method or system may proceed to 414D to determine whether there exists a second gap block having a sibling link with the first gap block or the corresponding neighboring gap block. If the determination is negative, the method or system may issue a warning or error and return to 402D to identify another lower or higher gap link for the first gap block, to 404B to identify another first gap block and its one or more neighboring gap blocks, or to end the process if no gap blocks are to be further processed. Otherwise, the method or system may remove the second gap block having the sibling link at 416D.

Figure 5:
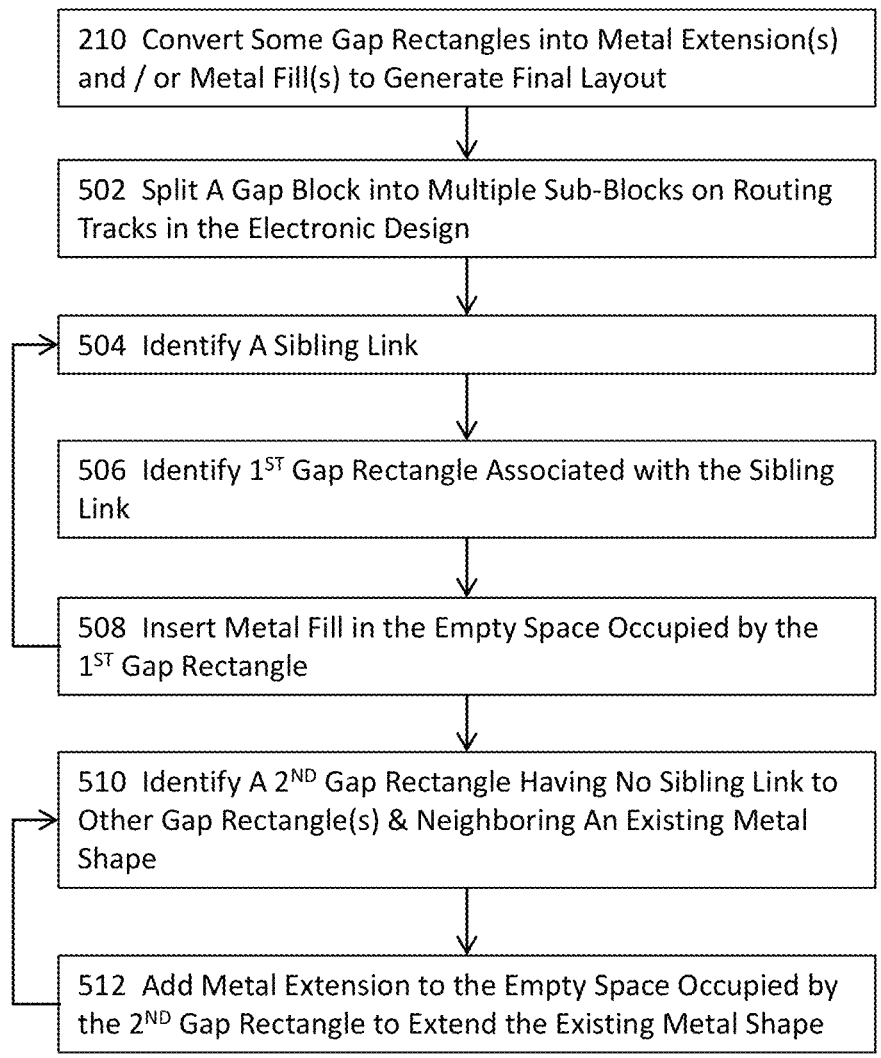
FIG. 5 illustrates a schematic flow diagram for a process or module illustrated in FIG. 2 for improving mask designs and manufacturability of electronic circuit designs for multi-exposure lithography in some embodiments.

FIG. 5 illustrates a schematic flow diagram for a process or module illustrated in FIG. 2 for improving mask designs and manufacturability of electronic circuit designs for multi-exposure lithography in some embodiments. More specifically, FIG. 5 illustrates more details about the process or module 210 for generating a physical design (e.g., a layout) by at least converting a gap rectangle into metal extension or metal fill to generate a final layout of FIG. 2. In these embodiments illustrated in FIG. 5, the method or system may split a gap block into multiple smaller sub-blocks on multiple tracks in the electronic design or a portion thereof at 502. Upon or shortly after splitting the identified gap block into multiple smaller sub-blocks, the method or system may insert a sibling link between each pair of immediately neighboring sub-blocks of the multiple smaller sub-blocks. The method or system may identify a sibling link between two sub-blocks of the multiple smaller sub-blocks at 504 and identify a first gap rectangle between two sub-blocks that are associated with the sibling link at 506. The method or system may then insert metal fill in the empty space occupied by the first gap rectangle at 508. The method or system may then iteratively process these multiple smaller sub-blocks determined by splitting the gap block until all the sibling links as a result of splitting the gap block are processed. At 510, the method or system may identify a second gap rectangle immediately adjacent to one or more sub-blocks that are not associated with any sibling links and also immediately neighboring an existing metal shape. The method or system may then add a metal extension element to fill the space occupied by the second gap rectangle at 512. The addition of the metal extension element to the empty space occupied by the second gap rectangle effectively extends the existing metal shape because the second gap rectangle is immediately adjacent to the existing metal shape. The method or system may then process the gap blocks and gap rectangles as described above to convert some gap rectangles into one or more metal fill elements and one or more metal extension elements. The result of various processes or actions described in this application is a highly structured physical design (e.g., a layout) of the original electronic design. One of the advantages of a highly structured physical design as described herein is that various metal shapes in the physical design will print with much better resolution during lithography and will better reflect and approximate what the intended shapes of these metal shapes are in the original design, with or even without subsequent OPC (optical proximity correction) processes.

Figure 6A:
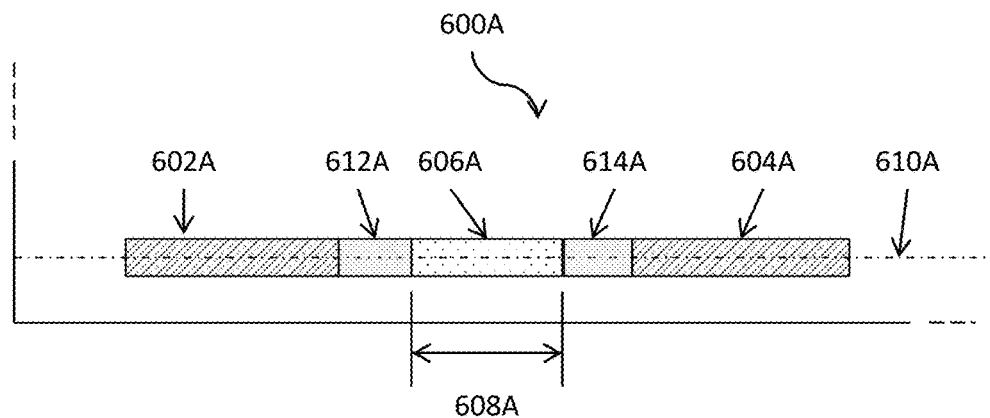
FIGS. 6A-D illustrate the graphical representation of some design rules in some embodiments.

FIGS. 6A-D illustrate the graphical representation of some design rules in some embodiments. More specifically, FIG. 6A shows a simplified graphical representation of a same track spacing rule 600A between two gap blocks 612A and 614A along the same track 610A. The same track spacing rule 600A requires the spacing 608A between the opposing ends of the two gap blocks 612A (with neighboring shape 602A) and 614A (with neighboring shape 604A) be greater than or equal to a prescribed value in some embodiments. The prescribed value may be constant or variable, depending upon the type of the shapes, the signals that these two shapes carry, the context (e.g., the surrounding shape(s) on the same layer or different layers) within which the two shapes, etc. When the empty space defined by the length 608A between the opposing ends of 612A and 614A and the width associated with the track 610A is identified as a gap rectangle 606A, the same track spacing rule then requires that the gap rectangle 606A must have at least a minimum length value as specified in the same track spacing rule as the prescribed spacing value 608A.

In some embodiments where the two shapes 612A and 614A are two gap blocks that share one common track and have a common parallel projection, the same track spacing rule prescribes a minimum spacing value between the opposing ends of the gap blocks 612A and 614A. A common parallel projection occurs when the projected geometric entities of two gap blocks along the same direction overlap with each other in some embodiments. For example, gap blocks 612A and 614A share a common projection because the projection of 612A and that of 614A along the horizontal direction overlap each other. It shall be noted that although gap block 612A (and its neighboring shape 602A) and gap block 614A (and its neighboring shape 604A) appear to have the same width, the widths of 612A and 614A may nevertheless differ at least in the context of gap blocks. This may be because gap blocks are formed with gap rectangles, and gap blocks 612A and 614A may thus have different widths. In some embodiments, gap block 612A or gap block 614A may span across multiple tracks. In the context of wires or interconnects 602A and 604A implemented along the track 610A, the widths of wires or interconnects 602A and 604A are identical because wires or interconnects not having the same width as the width value associated with the track 610A may not be implemented along track 610A. In either case (gap blocks having the same width or gap blocks having different width spanning across multiple tracks), gap blocks 612A and 614A share a common projection in, for example, the horizontal direction.

Figure 6B:
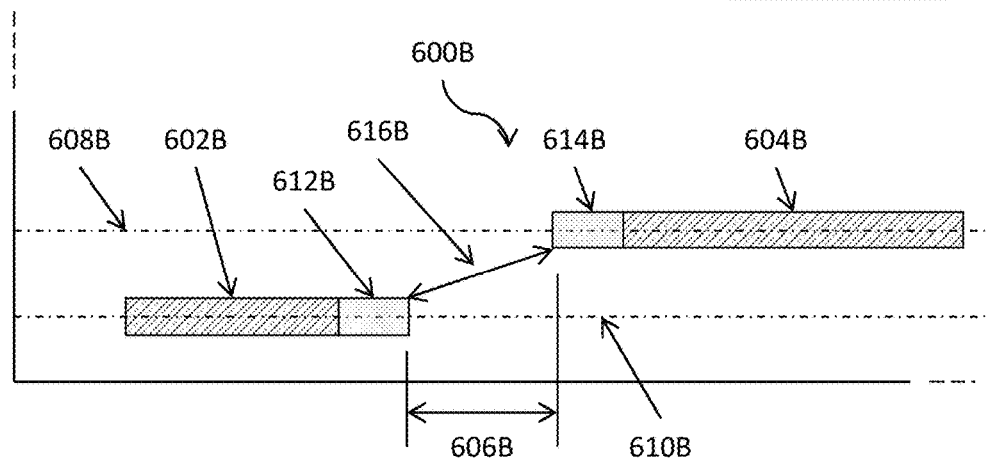

FIG. 6B shows a simplified graphical representation of a one-track spacing rule 600B in some embodiments. The one-track spacing rule applies when two gap blocks do not have a common parallel projection in either routing direction and are not separated by any tracks. As illustrated in FIG. 6B, the projection of gap block 612B (with neighboring shape 602B) and that of gap block 614B (with neighboring shape 604B) do not overlap each other regardless of which routing direction is selected for the projection. In addition, there exist no tracks situated between shape 602B (situated along track 610B) and shape 604B (situated along track 608B). The one-track spacing 600B requires that the spacing between two ends of the two gap blocks of interest be greater than or equal to a prescribed value. In some embodiments, the spacing between gap block 612B and gap block 614B may be the horizontal spacing 606B between two opposing ends of these two gap blocks. In some other embodiments, the spacing between these two gap blocks 612B and 614B may be the closest distance 616B between these two gap blocks. In some embodiments, the two shapes include two gap blocks, and the two-track spacing requires a minimum spacing between the opposing ends of these two gap blocks 612B and 614B.

Figure 6C:
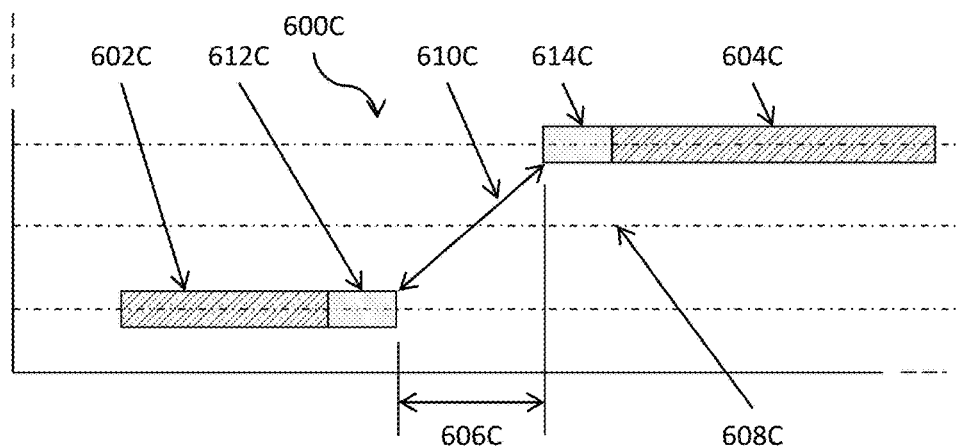

FIG. 6C shows a simplified graphical representation of a two-track spacing rule 600C in some embodiments. The two-track spacing rule applies when two shapes do not have a common parallel projection in either routing direction and are separated by one track. As illustrated in FIG. 6C, the projection of gap block 612C (with neighboring shape 602C) and that of gap block 614C (with neighboring shape 604C) do not overlap each other regardless of which routing direction is selected for the projection. In addition, there exist one track 608C situated between shape 602C and shape 604C. The two-track spacing 600C requires that the spacing between two ends of the two gap rectangles 612C and 614C be greater than or equal to a prescribed value. In some embodiments, the spacing between gap block 612C and gap block 614C may include the horizontal spacing 606C between two opposing ends of these two gap blocks 612C and gap block 614C. In some other embodiments, the spacing between these two gap blocks 612C and 614C may include the closest distance 610C between these two gap blocks. In some embodiments, the two shapes include two gap blocks, and the two-track spacing requires a minimum spacing between the opposing ends of these two gap blocks 612C and 614C.

Figure 6D:
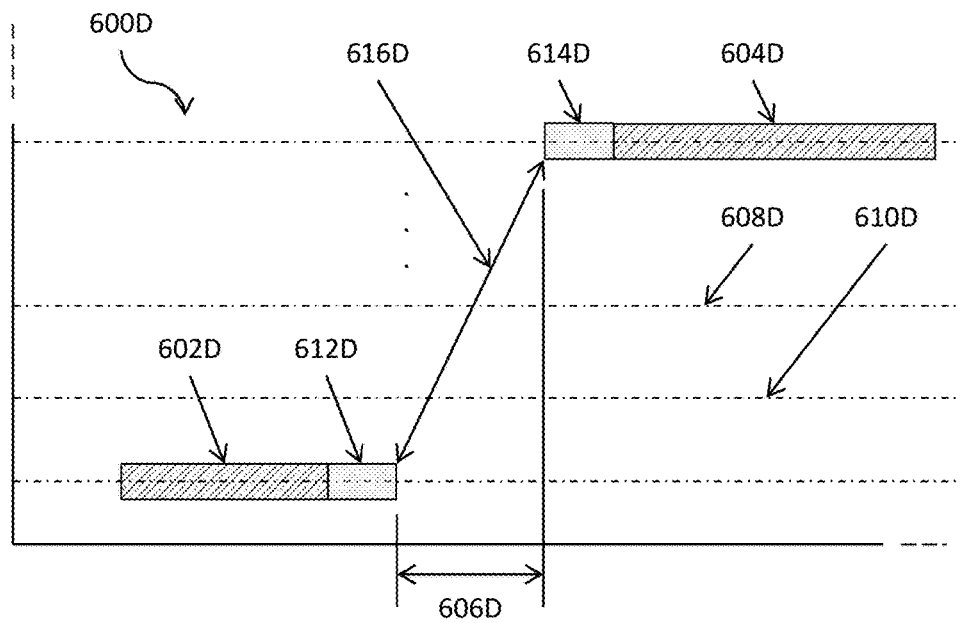

FIG. 6D shows a simplified graphical representation of a more general N-track spacing rule 600D in some embodiments where N includes a positive integer greater than two. The N-track spacing rule applies when two gap blocks do not have a common parallel projection in either routing direction and are separated by (N−1) tracks. As illustrated in FIG. 6D, the projection of gap block 612D (with neighboring shape 602D) and that of gap block 614D (with neighboring shape 604D) do not overlap each other regardless of which routing direction is selected for the projection. In addition, there exist (N−1) tracks 608D, 610D, etc. situated between shape 602D and shape 604D. The two track spacing 600D requires that the spacing between two ends of the two gap blocks of interest be greater than or equal to a prescribed value. In some embodiments, the spacing between gap block 612D and gap block 614D may include the horizontal spacing 606D between two opposing ends of these two gap blocks. In some other embodiments, the spacing between these two gap blocks 612D and 614D may include the closest distance 616D between these two gap blocks. In some embodiments, the two shapes include two gap blocks, and the two-track spacing requires a minimum spacing between the opposing ends of these two gap blocks 612D and 614D.

Figure 7A:
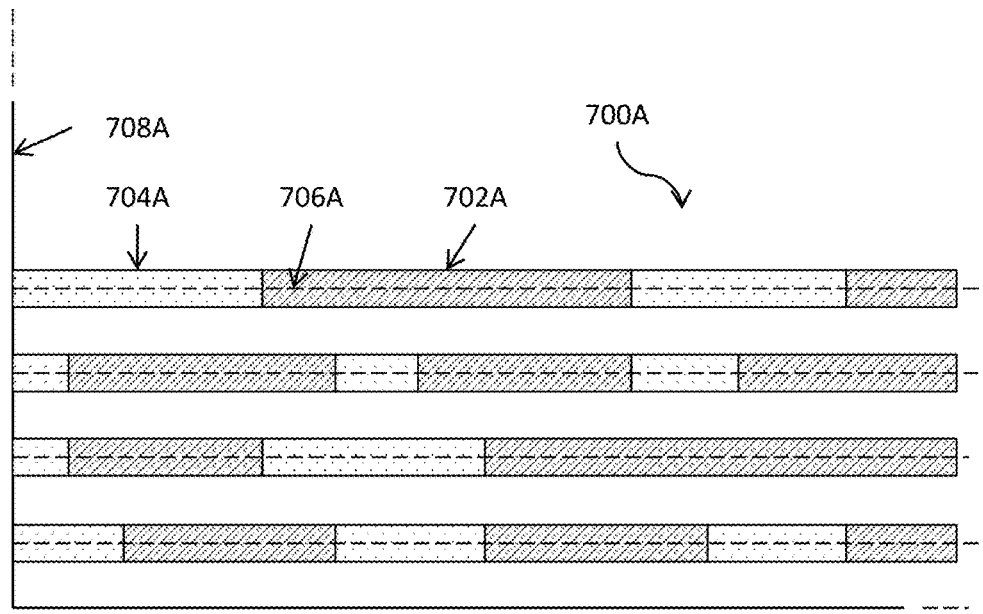
FIGS. 7A-H illustrate some simplified working examples to which some of the techniques described herein apply in some embodiments.

FIGS. 7A-H illustrate some simplified working examples to which some of the techniques described herein apply in some embodiments. More specifically, FIG. 7A illustrates a simplified portion of a layout 700A including a plurality of tracks 706A in the first direction. The portion also includes multiple shapes 702A that represent electronic design components such as wires or interconnects in the portion of the layout. The geometric entities 704A represent gap rectangles formed between two immediately neighboring shapes 702A or between a shape 702A and the boundary 708A of the portion or the layout. As it can be seen from FIG. 7A, each gap rectangle is formed with the length along the first direction between the opposing ends of two shapes 702A or between the boundary 708A of the portion or the layout and the near end of a shape 702A. Each gap rectangle is also formed with the width that is associated with its respective track 706A. It shall be noted that in these embodiments illustrated in FIGS. 7A-H, the widths of the shapes 702A also match those of their respective tracks because of, for example, a design rule that requires or desires that the width of a shape implemented along a track match the width associated with the track.

Figure 7B:
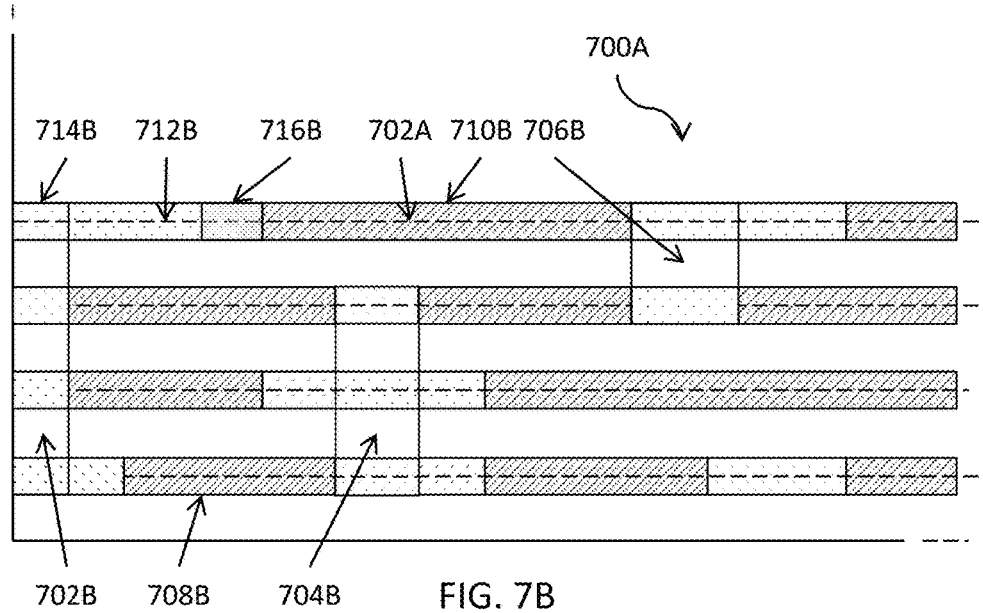

FIG. 7B illustrates further progress of some methods or processes performed on the illustrated layout or the portion thereof. More specifically, FIG. 7B shows the creation of three gap blocks 702B, 704B, and 706B from the respective groups of gap rectangles 704A. For example, gap block 702B may be created by identifying or determining the common parallel projection of the respective four gap rectangles as the width of the gap block to be formed. The length of the gap block 702B may be determined by spanning the gap block to cover area between the two outermost edges 708B and 710B of the gap rectangles of interest. FIG. 7B further illustrates splitting a larger gap rectangle 712B (which is a part of the gap rectangles 704A) into multiple smaller gap rectangles 714B and 716B if it is determined that the larger gap rectangle 712B has certain size or dimension(s) such that the smaller gap rectangles 714B and 716B meet one or more design rules in some embodiments. For example, the method or system may determine whether or not the spacing or closest distance between the smaller gap rectangles 714B and 716B satisfies the same track spacing requirement. In these embodiments where a larger gap rectangle (e.g., 712B) is split into multiple smaller gap rectangles (e.g., 714B and 716B), the method or system may further insert a sibling link between two immediately neighboring smaller gap rectangles. It shall be noted that FIGS. 7A-B also illustrate the legends used in FIGS. 7A-H.

Figure 7C:
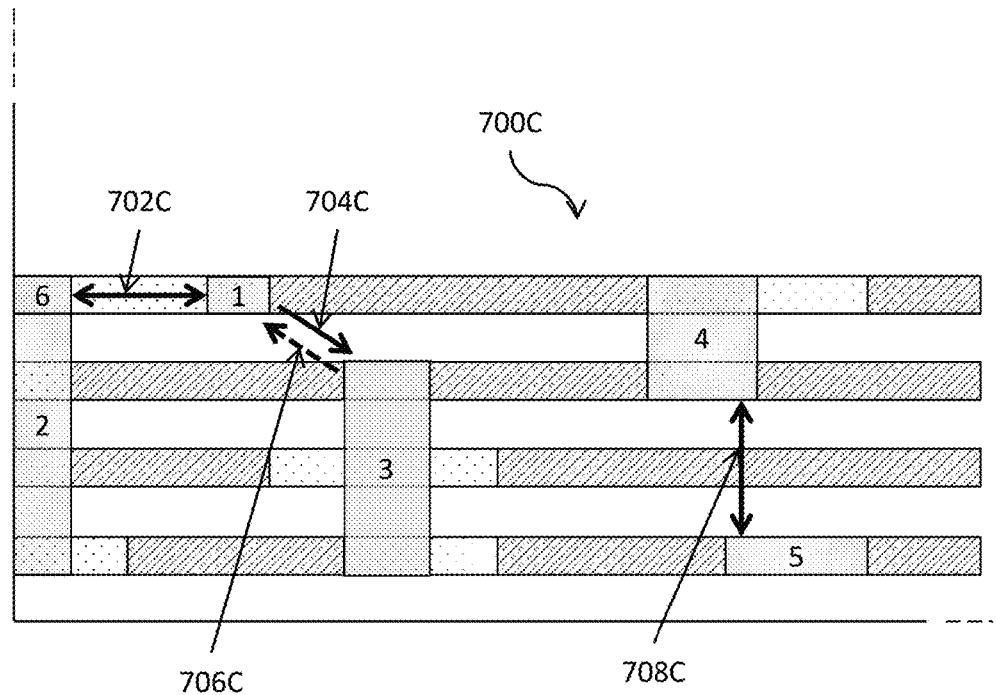

FIG. 7C illustrates further progress of some methods or processes performed on the illustrated layout or the portion thereof. More specifically, FIG. 7C illustrates the sibling link 702C associated with the two gap rectangles labeled "1" and "6" in a portion of an electronic design 700C. FIG. 7C further illustrates a lower gap link 706C that associates gap block formed by the smaller gap rectangle labeled "1" and having a smaller coordinate along the first direction (e.g., the direction of the tracks) with the gap block labeled "3" having a larger coordinate along the first direction. FIG. 7C also illustrates a higher gap link 704C that associates the smaller gap rectangle labeled "3" and having a larger coordinate along the first direction (e.g., the direction of the tracks) with the gap block formed from the smaller gap rectangle labeled "1" having a smaller coordinate along the first direction. In these embodiments, a lower gap link is created from a shape having a larger coordinate to another shape having a smaller coordinate (and hence the term "lower") in a particular direction (e.g., the direction of the track); and a higher gap link is created from a shape having a smaller coordinate to another shape having a larger coordinate (and hence the term "higher") in the same direction. In these embodiments, a higher gap link from a first gap block to a second gap block may be created when the second coordinate of a second reference point (e.g., the closest point to the first gap block) of the second gap block along a direction is larger than the first coordinate of a first reference point (e.g., a closest point to the second gap block) of the first gap block in the same direction.

In these embodiments, various methods or systems may generate a higher gap link and/or a lower gap link between two non-overlapping shapes on separate tracks to indicate that the distance between or relative position of the two shapes fails to satisfy one or more design rules. In this particular example, the method or system generates both the lower gap link 706C and the higher gap link 704C to indicate that the spacing or closest distance between the gap block derived from the gap rectangle labeled "1" and the gap block labeled "3" violates one or more design rules. Moreover, FIG. 7C illustrates an opposite link 708C between the gap block labeled "4" and the gap block labeled "5" to indicate that these two gap blocks labeled "4" and "5" may have violated one or more pertinent design rules (e.g., the two-track spacing rule as described above in FIG. 6C).

Figure 7D:
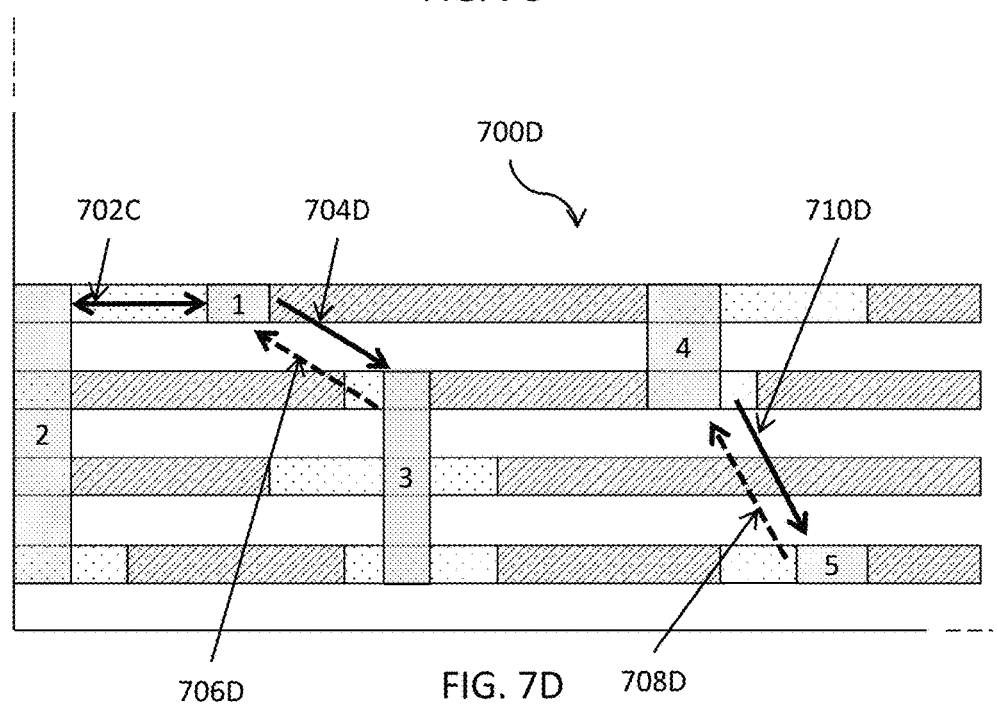

FIG. 7D illustrates further progress of some methods or processes performed on the illustrated layout or the portion thereof. More specifically, FIG. 7D illustrates a real-time or after-the-fact design rule check indicating that the design 700D as shown in FIG. 7C has violated one or more design rules between the gap block formed from the smaller gap rectangle labeled "1" and the gap block labeled "3". In FIG. 7D, the method or system generates both the lower gap link 706D and the higher gap link 704D (or inherits the higher gap link 704C and lower gap link 706C from FIG. 7C) to indicate that the spacing or closest distance between the gap block derived from the gap rectangle labeled "1" and the gap block labeled "3" violates one or more design rules. The method or system may then adjust one or both gap blocks associated with the lower and higher gap links.

In this particular example illustrated in FIG. 7D, the method or system adjusts the width of the gap block labeled "3" to a smaller width value in order to satisfy the one or more design rules violated by these two gap blocks as illustrated in FIG. 7C. Similarly, the opposite link 708C also indicates the violation of one or more design rules between the gap blocks labeled "4" and "5". Upon or shortly after detecting or creating an opposite link (e.g., 708C of FIG. 7C), the method or system may adjust one or both shapes to fix the violation. In this particular example illustrated in FIG. 7D, the method or system adjusts the widths of both gap blocks labeled "4" and "5" to smaller width values. If the adjustment of the one or both shapes renders these two shapes to satisfy the one or more design rules violated by the original design as indicated by the opposite link, the method or system may then convert the opposite link into a higher gap link, a lower gap link, or both. In this particular example, the method or system converts the opposite link 708C into the lower gap link 708D and the higher gap link 710D after the adjustment to both gap blocks.

Figure 7E:
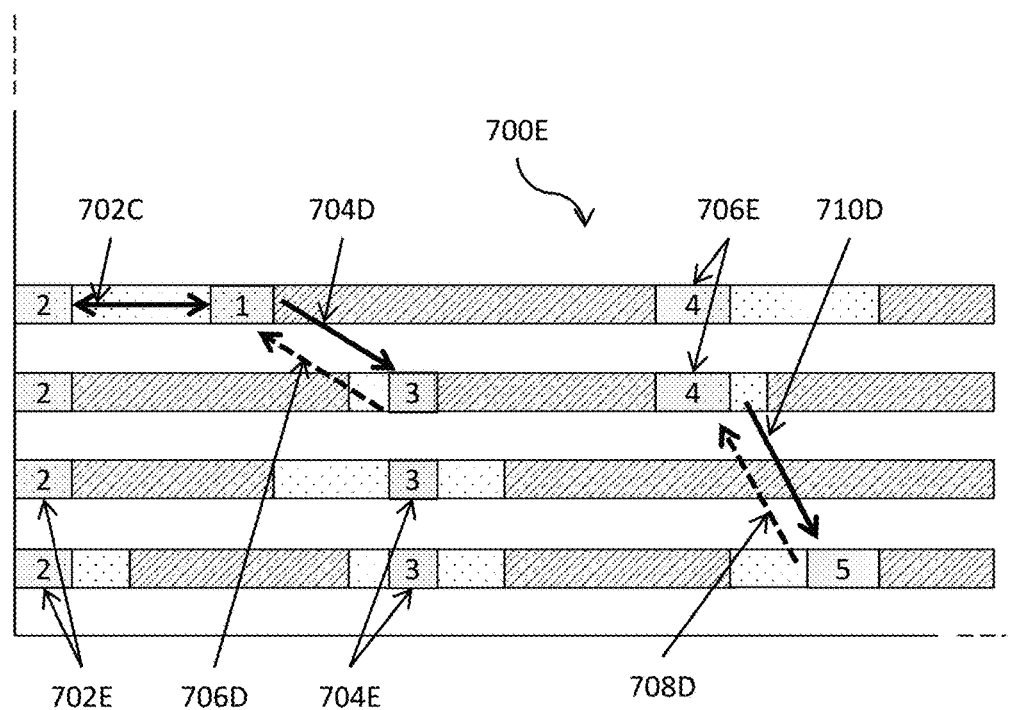

FIG. 7E illustrates that the method or system may split one or more gap blocks into multiple smaller sub-blocks along multiple tracks. More specifically, the gap block labeled "2" in the portion of electronic design 700E illustrated in FIG. 7D is split into four sub-blocks 702E; the adjusted gap block labeled "3" in FIG. 7D is split into three smaller sub-blocks 704E; and the gap block labeled "4" in FIG. 7D is split into two smaller sub-blocks 706E as illustrated in FIG. 7E.

Figure 7F:
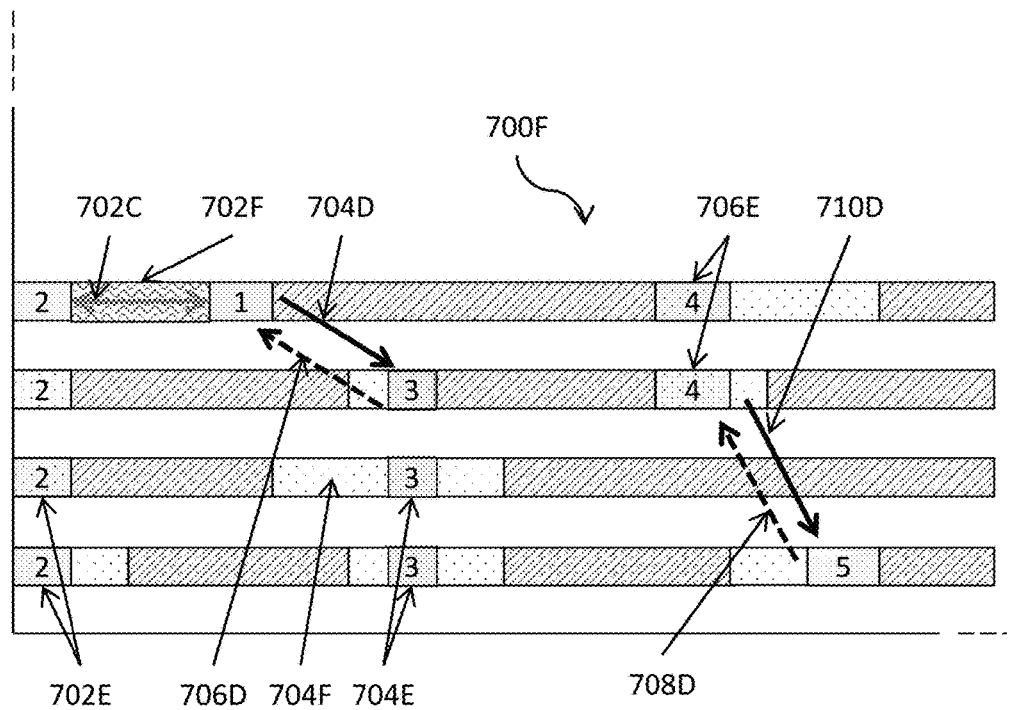

FIG. 7F illustrates the insertion of metal fills for the portion of the layout of FIG. 7E. In these embodiments, the method or system may identify a sibling link between two sub-blocks and identify a first gap rectangle between these two sub-blocks that are associated with the sibling link. Once the gap rectangle is identified, the method or system may then insert metal fill in the empty space occupied by the first gap rectangle. In these embodiments illustrated in FIG. 7F, the method or system identifies the sibling link 702C enclosed by two sub-blocks in the portion of the electronic design 700F, identifies the gap rectangle 702F neighboring both sub-blocks, and inserts metal fill in the space occupied by the gap rectangle 702F.

Figure 7G:
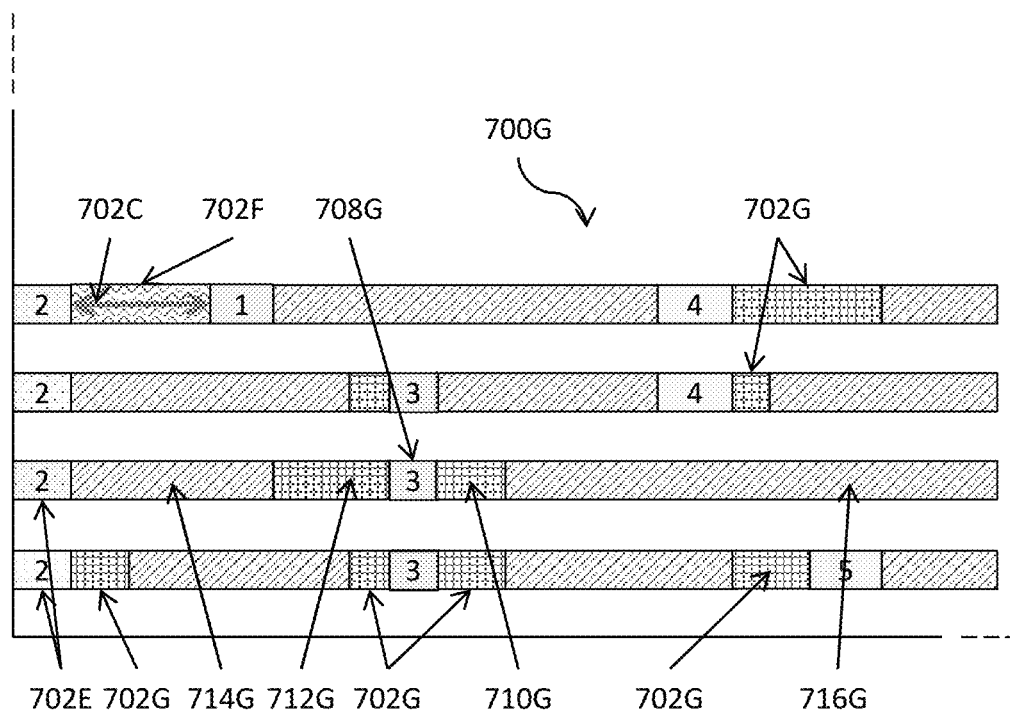

FIG. 7G illustrates extensions of metal shapes for the portion of the layout of FIG. 7F. In these embodiments illustrated in FIG. 7G, the method or system may identify a gap rectangle immediately adjacent to one or more sub-blocks that are not associated with any sibling links. Once the gap rectangle is identified, the method or system may then add metal extension to one or both ends of the second gap rectangle to fill the empty space between one or more existing metal shapes and the identified gap block. For example, the method may identify the gap rectangle 704F (see FIG. 7F) that is immediately adjacent to the gap block 708G in the portion of the layout 700G. The gap rectangle 704F is not associated with any sibling links with other gap blocks or gap rectangles. Therefore, the method or system may add metal extension 712G to the space occupied by gap rectangle 704F of FIG. 7F. This metal extension 712G effectively extends the metal shape 714G now occupying the space covered by both 714G and 712G illustrated in FIG. 7G. The method or system may similarly insert metal extension 710G to extend metal shape 716G. In FIG. 7G, shapes 702G represent metal extensions added by various methods or system described in this Application to extend existing metal shapes.

Figure 7H:
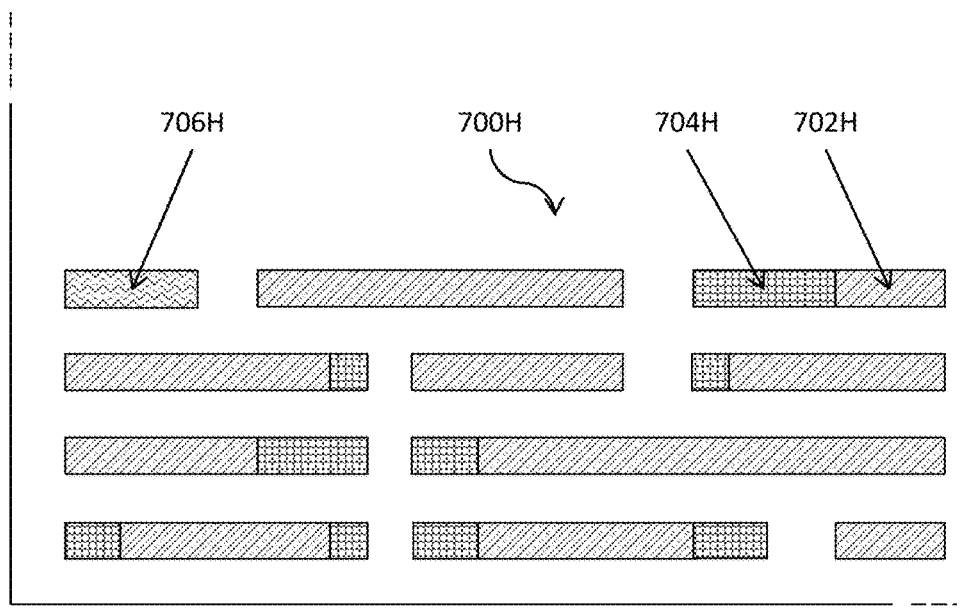

FIG. 7H illustrates a finished portion of the layout. More specifically, FIG. 7H illustrates that the method or system may thus generate the finished portion of the layout by removing the gap blocks and the smaller sub-blocks from the portion 700H illustrated in FIG. 7G. It shall be noted that although FIG. 7H still shows different patterns for the originally designed metal shapes 702H as well as the metal extensions 704H, the connected metal shape 702H and metal extension 704H are treated as one integral metal shape because they are designed to be manufactured as a single, integral metal shape. As described with reference to FIG. 7F, 706H indicates a metal fill element in the portion of the layout 700H.

System Architecture Overview

Figure 8:
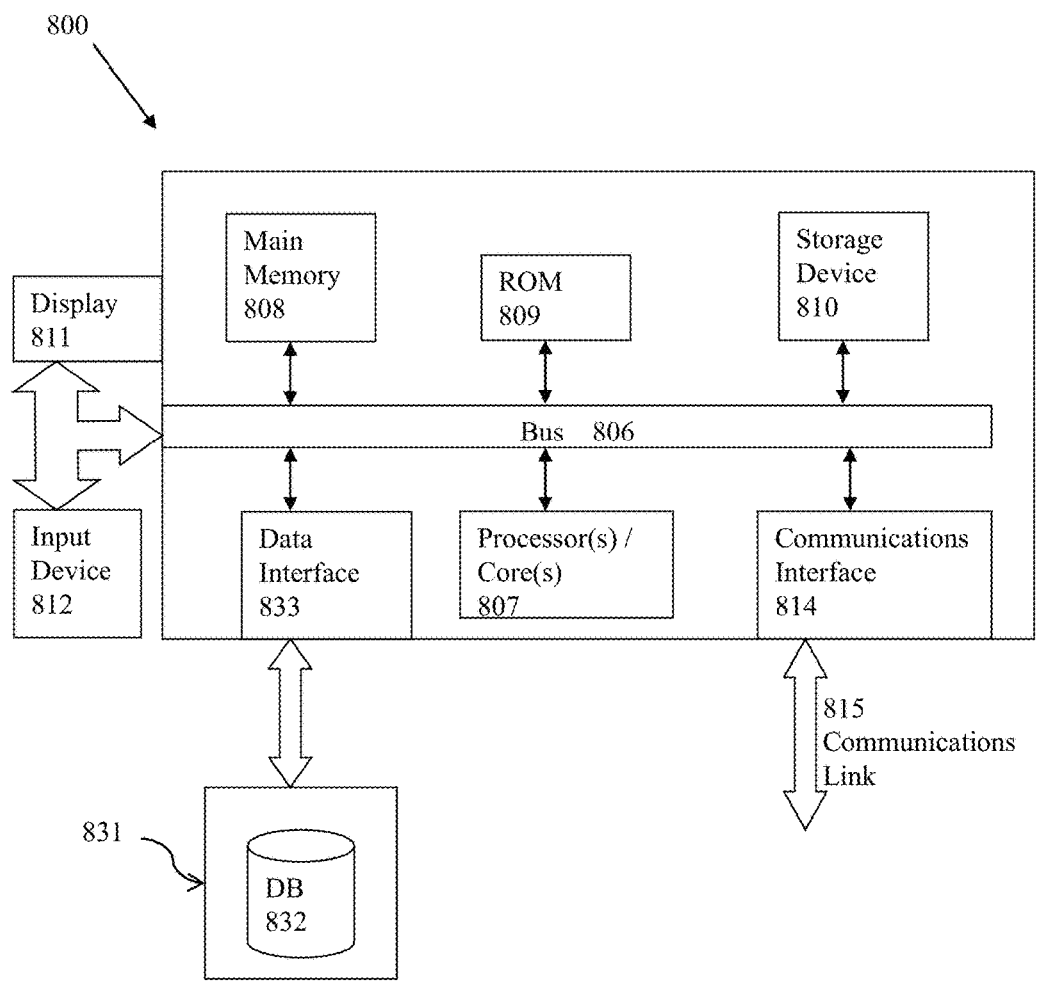
FIG. 8 illustrates a computerized system on which a method for improving mask designs and manufacturability of electronic circuit designs for multi-exposure lithography may be implemented.

FIG. 8 illustrates a block diagram of an illustrative computing system 800 suitable for enhancing manufacturability of electronic designs for multi-exposure lithography as described in the preceding paragraphs with reference to various figures. Computer system 800 includes a bus 806 or other communication mechanism for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment, computer system 800 performs specific operations by one or more processor or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 807, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computer system 800 operates in conjunction with a data storage system 831, e.g., a data storage system 831 that includes a database 832 that is readily accessible by the computer system 800. The computer system 800 communicates with the data storage system 831 through a data interface 833. A data interface 833, which is coupled to the bus 806 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for improving mask designs and manufacturability of electronic circuit designs for multi-exposure lithography, comprising:
   identifying, at a gap rectangle module that functions in conjunction with at least one micro-processor, gap rectangles based at least in part upon metal shapes in a portion of an electronic design, wherein a gap rectangle comprises a referencing rectangular region that is oriented along a routing track and has a width value inherited from the routing track with a length value defined by at least one metal shape along the routing track;
   creating one or more gap blocks comprising at least the gap rectangles; and
   generating a physical design by at least converting at least one gap rectangle of the gap rectangles into metal fill or metal extension that fills the at least one gap rectangle based at least in part upon the one or more gap blocks.

2. The computer implemented method of claim 1, further comprising:
   determining a relation data structure for the gap rectangles, gap blocks, or a combination thereof; and
   adjusting a first gap block of the gap blocks.

3. The computer implemented method of claim 2, the act of determining the relation data structure comprising:
   identifying a first gap block and one or more neighboring gap blocks that neighbor the first gap block;
   determining whether the first gap block shares an opposite link with one or more of the one or more neighboring gap blocks; and
   determining whether a first size or a first dimension of the first gap block may be adjusted.

4. The computer implemented method of claim 3, the act of determining the relation data structure comprising:
   changing the first size or the first dimension of the first gap block in a first direction, wherein it is determined that the first size or the first dimension of the first gap block may be adjusted;
   changing a second size or a second dimension of a neighboring gap block of the one or more neighboring gap blocks associated with the opposite link; and
   determining whether the portion of the electronic design satisfies one or more design rules governing at least the first gap block and the neighboring gap block.

5. The computer implemented method of claim 3, the act of determining the relation data structure comprising:
   removing the first gap block or a neighboring gap block from the portion of the electronic design; and
   determining whether the portion of the electronic design satisfies one or more design rules governing at least the portion without the first gap block or the neighboring gap block in the portion.

6. The computer implemented method of claim 3, the act of determining the relation data structure comprising:
   moving the first gap block at a first location or a neighboring gap block at a second location to one or more different locations in the portion of the electronic design; and
   determining whether the portion of the electronic design satisfies one or more design rules governing at least the first gap block or the neighboring gap block that are moved to the one or more different locations.

7. The computer implemented method of claim 3, the act of determining the relation data structure comprising:
   adjusting at least one neighboring gap block of the one or more neighboring gap blocks.

8. The computer implemented method of claim 7, the act of determining the relation data structure further comprising:
   identifying a lower gap link or a higher gap link between the first gap block and the one or more neighboring gap blocks;
   identifying the at least one neighboring gap block based at least in part upon the lower gap link or the higher gap link; and
   identifying a sibling link and a first neighboring gap block associated with the sibling link.

9. The computer implemented method of claim 1, the act of identifying gap rectangles comprising:
   identifying a track in the portion of the electronic design;
   identifying a gap along the track by traversing the track;
   identifying a length and/or a width of the gap; and
   identifying a first gap rectangle of the gap rectangles by using at least the length of the gap.

10. The computer implemented method of claim 9, the act of identifying gap rectangles further comprising:
    identifying or determining an order of processing for at least the portion of the electronic design;
    identifying one or more additional tracks in the portion of the electronic design; and
    identifying one or more remaining gap rectangles of the gap rectangles by at least scanning or traversing the one or more additional tracks based at least in part the order of processing.

11. The computer implemented method of claim 1, the act of creating the one or more gap blocks by using at least the gap rectangles comprising:
    identifying a first gap rectangle along a first track in the portion of the electronic design; and
    identifying a neighboring gap rectangle along a second track that neighbors the first track in the portion of the electronic design.

12. The computer implemented method of claim 11, the act of creating the one or more gap blocks by using at least the gap rectangles comprising:
    determining a common parallel projection along a first direction for the first gap rectangle and the neighboring gap rectangle;
    determining whether the common parallel projection satisfies one or more first design rules;

determining whether the first gap rectangle or the neighboring gap rectangle is a part of a first gap block of the gap blocks; and extending the first gap block based at least in part upon a criterion, wherein the first gap rectangle or the neighboring gap rectangle is determined to be the part of the first gap block.

13. The computer implemented method of claim 11, the act of creating the one or more gap blocks by using at least the gap rectangles comprising:

identifying one or more second design rules;

determining whether the first gap rectangle satisfies the one or more second design rules;

splitting the first gap rectangle into multiple smaller gap rectangles based at least in part upon the one or more second design rules;

creating a sibling link between at least two smaller gap rectangles of the multiple gap rectangles; and associating the sibling link with the at least two smaller gap rectangles by using a relation graph or a data structure.

14. The computer implemented method of claim 1, the act of generating the physical design by at least converting the gap rectangle comprising:

splitting a gap block into multiple smaller gap blocks along a track in the portion of the electronic design;

associating at least one sibling link between two smaller gap blocks of the multiple smaller gap blocks;

identifying a first gap rectangle corresponding to the sibling link; and inserting a metal fill element in an area occupied by the first gap rectangle.

15. A system for enhancing electronic designs for multi-exposure lithography, comprising:

non-transitory memory storing thereupon program code that comprises a sequence of instructions;

a processor or a processor core that executes one or more threads of execution of a computing system, wherein the sequence of instructions executed by the processor or processor core causes the processor or processor core to at least identify gap rectangles based at least in part upon metal shapes from a portion of an electronic design via one or more computer bus architectures or communication interfaces, wherein a gap rectangle comprises a referencing rectangle that is oriented along a routing track and has a width value inherited from the routing track with a length value defined by at least one metal shape along the routing track; create one or more gap blocks comprising at least the gap rectangles; and generate a physical design for storage in a non-transitory computer accessible storage medium by at least converting at least one gap rectangle of the gap rectangles into metal fill or metal extension that fills the at least one gap rectangle based at least in part upon the one or more gap blocks.

16. The system of claim 15, wherein the non-transitory memory stores the program code, and the program code includes further instructions that, when executed by the processor or processor core, cause the processor or processor core to determine a relation data structure for the gap rectangles, gap blocks, or a combination thereof; and adjust a first gap block of the gap blocks.

17. The system of claim 16, wherein the non-transitory memory holds the program code, and the program code includes further instructions that, when executed by the processor or processor core, cause the processor or processor core to identify a first gap block and one or more neighboring gap blocks that neighbor the first gap block; identify an identified gap block from the first gap block and the one or more neighboring gap blocks; and adjust the identified gap block.

18. The system of claim 17, wherein the non-transitory memory holds the program code that comprises the further instructions causing the processor or processor core to adjust the identified gap block, the program code further includes the further instructions that, when executed by the processor or processor core, cause the processor or processor core to identify a high gap link or a lower gap link between the first gap block and a neighboring gap block of the one or more neighboring gap blocks; and adjust a size or a dimension of the identified gap block; determine whether one or more design rules are satisfied.

19. The system of claim 17, wherein the non-transitory memory holds the program code that comprises the further instructions that cause the processor or processor core to adjust the identified gap block, the program code further includes the further instructions that, when executed by the processor or processor core, cause the processor or processor core to identify a sibling gap link within the portion of the electronic design; identify a second gap block associated with the sibling gap link; and remove the second gap block associated with the sibling link.

20. The system of claim 15, wherein the non-transitory memory holds the program code that comprises the further instructions causing the processor or processor core to generate the physical design, the program code further includes the further instructions that, when executed by the processor or processor core, cause the processor or processor core to split a first gap block into multiple smaller gap blocks along multiple routing tracks in the portion of the electronic design; identify a sibling link between one smaller gap block of the multiple smaller gap blocks and another gap block; identify a first gap rectangle associated with the sibling link; and insert a metal fill element in an empty space occupied by the first gap rectangle.

21. The system of claim 15, wherein the non-transitory memory holds the program code that comprises the further instructions causing the processor or processor core to generate the physical design, the program code further includes the further instructions that, when executed by the processor or processor core, cause the processor or processor core split a first gap block into multiple smaller gap blocks along multiple routing tracks in the portion of the electronic design; identify a second gap rectangle neighboring an existing metal shape and associated with no sibling links; and insert a metal extension element to fill an empty space occupied by the second gap rectangle to extend the existing metal shape.

22. An article of manufacture comprising a non-transitory computer accessible storage medium having stored thereupon a sequence of instructions which, when executed by at least one processor or processor core executing one or more threads, causes the at least one processor or processor core to perform a plurality of acts for enhancing electronic designs for multi-exposure lithography, the plurality of acts comprising:

identifying gap rectangles based at least in part upon metal shapes in a portion of an electronic design, wherein a gap rectangle comprises a referencing rectangle that is oriented along a routing track and has a width value inherited from the routing track with a length value defined by at least one metal shape along the routing track;

creating one or more gap blocks comprising at least the gap rectangles; and generating a physical design by at least converting at least one gap rectangle of the gap rectangles into metal fill or metal extension that fills the at least one gap rectangle based at least in part upon the one or more gap blocks.

23. The article of manufacture of claim 22, the plurality of acts further comprising:

determining a relation data structure for the gap rectangles, gap blocks, or a combination thereof; and adjusting a first gap block of the gap blocks.

24. The article of manufacture of claim 23, the process further comprising:

identifying a first gap block and one or more neighboring gap blocks that neighbor the first gap block;

identifying an identified gap block from the first gap block and the one or more neighboring gap blocks; and adjusting the identified gap block.

25. The article of manufacture of claim 24, wherein the act of adjusting the identified gap block comprising:

identifying a higher gap link or a lower gap link between the first gap block and a neighboring gap block of the one or more neighboring gap blocks; and adjusting a size or a dimension of the identified gap block; determine whether one or more design rules are satisfied.

26. The article of manufacture of claim 24, wherein the act of adjusting the identified gap block comprising:

identifying a sibling gap link within the portion of the electronic design;

identifying a second gap block associated with the sibling gap link; and removing the second gap block associated with the sibling link.

27. The article of manufacture of claim 22, the plurality of acts further comprising:

splitting a first gap block into multiple smaller gap blocks along multiple routing tracks in the portion of the electronic design;

identifying a sibling link between one smaller gap block of the multiple smaller gap blocks and another gap block;

identifying a first gap rectangle associated with the sibling link; and inserting a metal fill element in an empty space occupied by the first gap rectangle.

28. The article of manufacture of claim 22, the plurality of acts further comprising:

splitting a first gap block into multiple smaller gap blocks along multiple routing tracks in the portion of the electronic design;

identifying a second gap rectangle neighboring an existing metal shape and associated with no sibling links; and inserting a metal extension element to fill an empty space occupied by the second gap rectangle to extend the existing metal shape.

* * * * *